United States Patent
Kim et al.

(10) Patent No.: US 12,464,719 B2
(45) Date of Patent: Nov. 4, 2025

(54) SEMICONDUCTOR DEVICES

(71) Applicant: Samsung Electronics Co., Ltd., Suwon-si (KR)

(72) Inventors: Taeyoung Kim, Suwon-si (KR); Yongseok Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 309 days.

(21) Appl. No.: 18/183,903

(22) Filed: Mar. 14, 2023

(65) Prior Publication Data
US 2023/0413557 A1 Dec. 21, 2023

(30) Foreign Application Priority Data
May 27, 2022 (KR) ................ 10-2022-0065536

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC ............................ H10B 43/27; H10B 41/27
USPC ........................................................ 257/314
See application file for complete search history.

(56) References Cited

U.S. PATENT DOCUMENTS

| | | | |
|---|---|---|---|
| 10,720,437 B2 | 7/2020 | Yoo | |
| 10,734,406 B2 | 8/2020 | Yamasaki et al. | |
| 10,734,409 B2 | 8/2020 | Yoo | |
| 2021/0074726 A1 | 3/2021 | Lue | |
| 2021/0264959 A1* | 8/2021 | Rabkin | H10D 64/689 |
| 2021/0375934 A1 | 12/2021 | Lu et al. | |
| 2022/0020772 A1 | 1/2022 | Lee et al. | |
| 2022/0020775 A1 | 1/2022 | Yang et al. | |
| 2022/0310656 A1* | 9/2022 | Rabkin | H10B 51/20 |
| 2023/0164995 A1* | 5/2023 | Yamashita | H10B 41/27 257/314 |
| 2023/0269941 A1* | 8/2023 | Lee | H10B 41/35 257/314 |

* cited by examiner

*Primary Examiner* — Igwe U Anya
(74) *Attorney, Agent, or Firm* — Wolf, Greenfield & Sacks, P.C.

(57) ABSTRACT

A semiconductor device includes a source structure, a plurality of gate electrodes on the source structure. The plurality of gate electrodes are stacked and spaced apart from each other in a first direction and extend in a second direction perpendicular to the first direction, and a channel structure in a channel hole extends through the plurality of gate electrodes and in the first direction, the channel structure including a first dielectric layer on a sidewall of the channel hole, a second dielectric layer on the first dielectric layer opposite the sidewall of the channel hole, a channel layer on the second dielectric layer opposite the sidewall of the channel hole, and a filling insulating layer on the channel layer opposite the sidewall of the channel hole, and further including a channel pad layer in a region including an upper end of the channel hole, wherein the second dielectric layer includes a ferroelectric material, and wherein the channel pad layer is in contact with an internal side surface of the first dielectric layer and covers an upper surface of the second dielectric layer, an upper surface of the channel layer, and an upper surface of the filling insulating layer.

20 Claims, 24 Drawing Sheets

SEMICONDUCTOR DEVICES

CROSS-REFERENCE TO RELATED APPLICATION(S)

This application claims benefit of priority to Korean Patent Application No. 10-2022-0065536 filed on May 27, 2022, in the Korean Intellectual Property Office, the disclosure of which is incorporated herein by reference in its entirety.

BACKGROUND

Example embodiments of the present disclosure relate to a semiconductor device.

A semiconductor device able to store high-capacity data in a data storage system requiring data storage is being developed, and a method for increasing data storage capacity of a semiconductor device has been researched. For example, as a method for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device having improved integration density and mass productivity.

According to an example embodiment of the present disclosure, a semiconductor device includes a source structure, a plurality of gate electrodes on the source structure. The gate electrodes of the plurality of gate electrodes are stacked and spaced apart from each other in a first direction perpendicular to an upper surface of the source structure and extend in a second direction perpendicular to the first direction. A channel structure is in a channel hole extending through the plurality of gate electrodes and in the first direction, the channel structure including a first dielectric layer on a sidewall of the channel hole, a second dielectric layer on an internal side surface of the first dielectric layer opposite the sidewall of the channel hole, a channel layer on an internal side surface of the second dielectric layer opposite the sidewall of the channel hole, and a filling insulating layer on an internal side surface of the channel layer opposite the sidewall of the channel hole, and further including a channel pad layer in a region including an upper end of the channel hole, wherein the second dielectric layer includes a ferroelectric material, and wherein the channel pad layer is in contact with an internal side surface of the first dielectric layer and covers an upper surface of the second dielectric layer, an upper surface of the channel layer, and an upper surface of the filling insulating layer.

According to an example embodiment of the present disclosure, a semiconductor device includes a source structure, a plurality of gate electrodes on the source structure. The gate electrodes of the plurality of gate electrodes are stacked and spaced apart from each other in a vertical direction perpendicular to an upper surface of the source structure, and a channel structure is in a channel hole extending through the gate electrodes and in the vertical direction, wherein the channel structure includes a dielectric layer extending in the vertical direction and including a ferroelectric material or an anti-ferroelectric material, a channel layer on an internal side of the dielectric layer, and a channel pad layer in an upper end of the channel hole, wherein an upper end of the dielectric layer is on a level lower than a level of an upper surface of the channel pad layer.

According to an example embodiment of the present disclosure, a semiconductor device includes a plate layer, a plurality of gate electrodes on the plate layer. The gate electrodes of the plurality of gate electrodes are stacked and spaced apart from each other in a vertical direction perpendicular to an upper surface of the plate layer, and a channel structure is in a channel hole extending through the gate electrodes and extending in the vertical direction, wherein the channel structure includes a dielectric layer extending in the vertical direction and including a ferroelectric material, a channel layer on an internal side of the dielectric layer, and a channel pad layer in an upper end of the channel hole and in contact with an upper surface of the dielectric layer, and wherein data is written using a polarization state of the dielectric layer.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
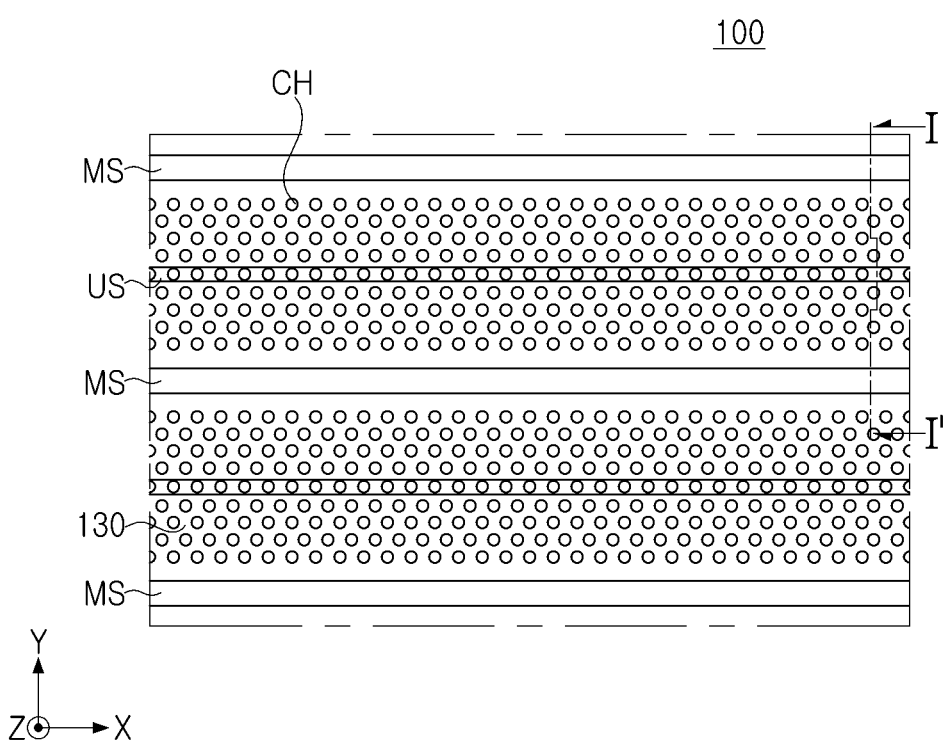
FIG. 1 is a plan view illustrating a semiconductor device according to an example embodiment of the present disclosure.

FIG. 1 is a plan view illustrating a semiconductor device according to an example embodiment.

Figure 2:
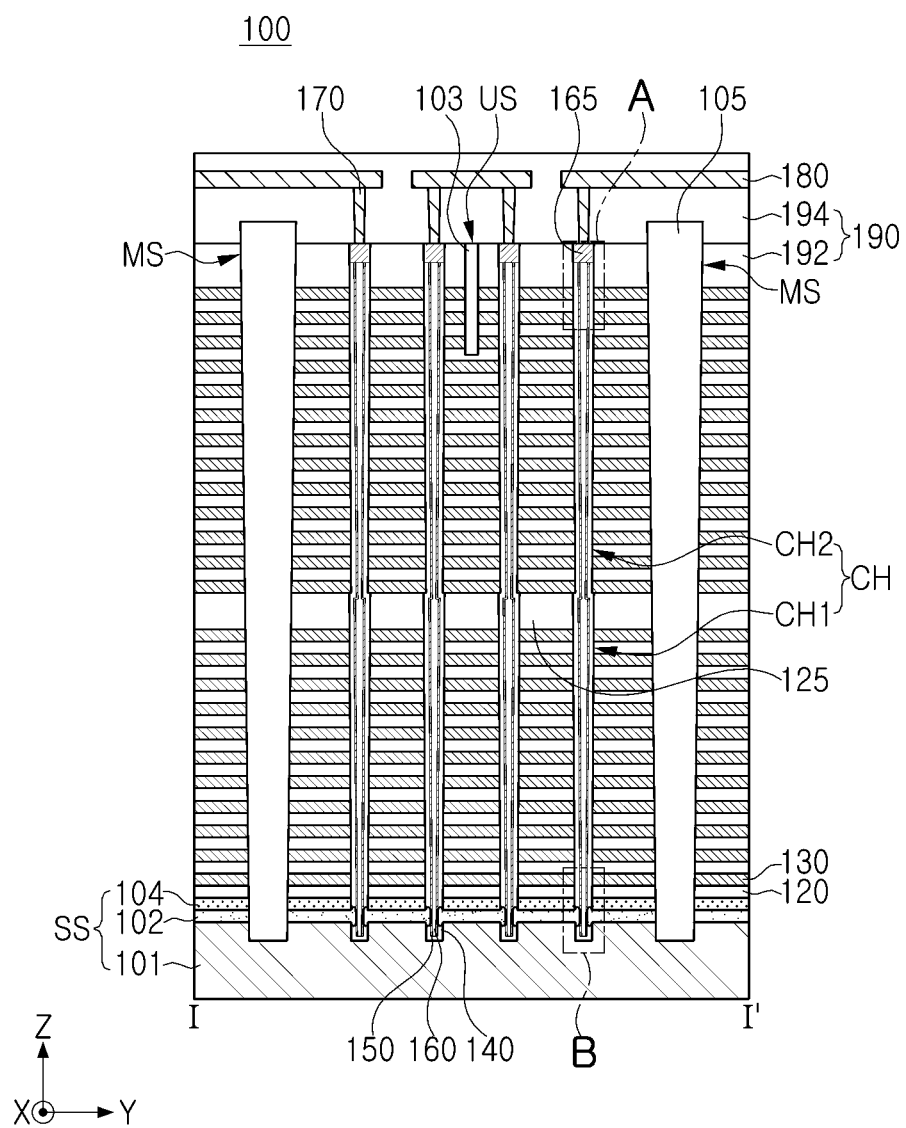
FIG. 2 is a cross-sectional view illustrating a semiconductor device according to an example embodiment of the present disclosure.

FIG. 2 is a cross-sectional view illustrating a semiconductor device according to an example embodiment, taken along line I-I' in FIG. 1.

Figure 3A:
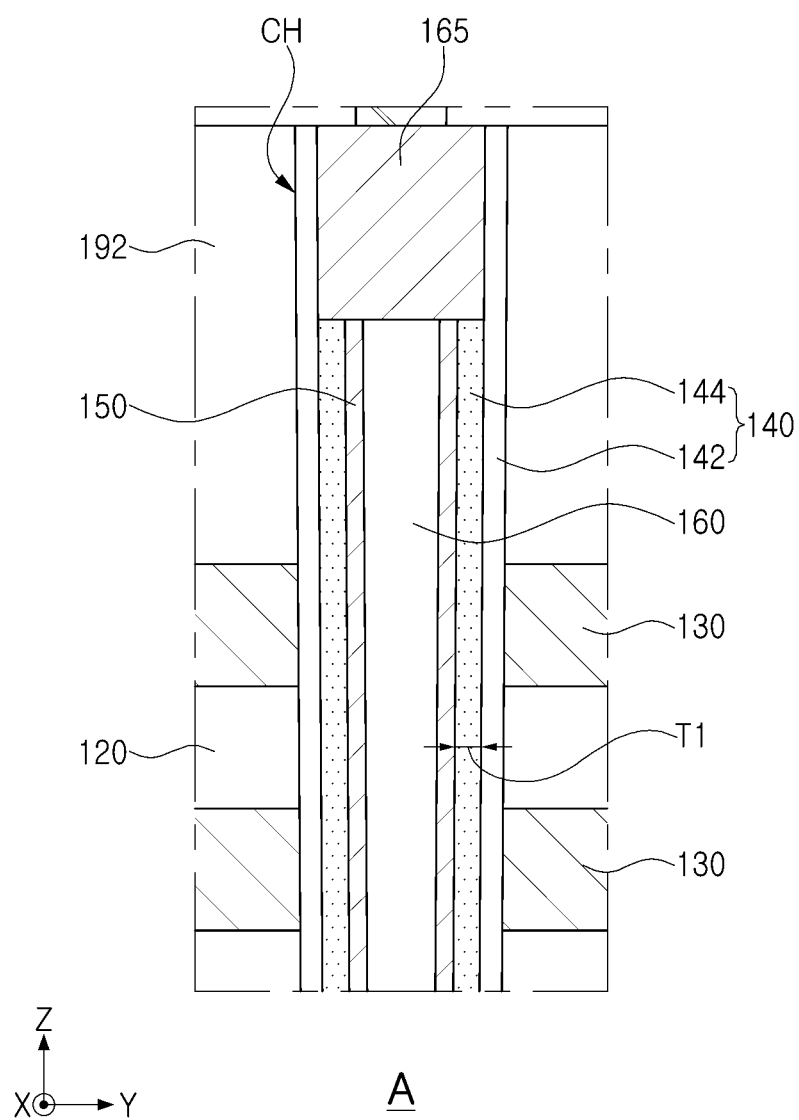
FIGS. 3A and 3B are enlarged views illustrating a portion of a semiconductor device according to an example embodiment of the present disclosure.
Figure 3B:
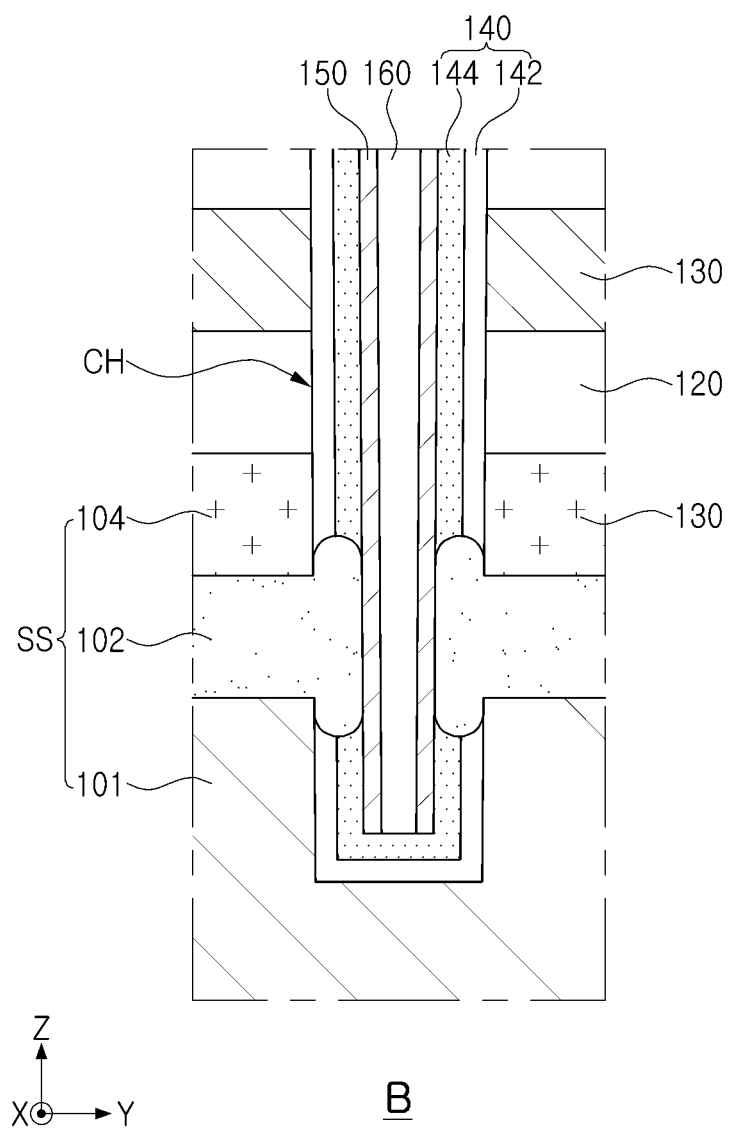

FIGS. 3A and 3B are enlarged views illustrating a portion of a semiconductor device according to an example embodiment. FIG. 3A is an enlarged view illustrating region "A" in FIG. 2, and FIG. 3B is an enlarged view illustrating region "B" in FIG. 2.

Referring to FIGS. 1 to 3B, a semiconductor device 100 may include a source structure SS, gate electrodes 130 stacked on the source structure SS, interlayer insulating layers 120 alternately stacked with the gate electrodes 130 on the source structure SS, channel structures CH in a channel hole and extending into a stack structure of the gate electrodes 130, upper isolation regions US extending into a portion of the stack structure, isolation regions MS extending through the stack structure, contact plugs 170 on the channel structures CH, interconnection lines 180 on the contact plugs 170, and a cell region insulating layer 190 on the gate electrodes 130 and the channel structures CH. Each of the channel structures CH may include a dielectric layer 140, a channel layer 150, and a filling insulating layer 160 positioned in order from the gate electrodes 130 and may further include an upper channel pad layer 165. That is, the dielectric layer 140 is on or adjacent the sidewall of the channel hole, the channel layer 150 is on an interior side surface of the dielectric layer 140 opposite the sidewall of the channel hole, and the filling insulating layer 160 is on an interior side surface of the channel layer opposite the sidewall of the channel hole, In the semiconductor device 100, a memory cell string may be configured around each channel structure CH, and a plurality of memory cell strings may be arranged in columns and rows in the x-direction and the y-direction.

The source structure SS may include a substrate 101 and first and second horizontal conductive layers 102 and 104. The substrate 101 may be configured as a conductive plate layer and may have an upper surface extending in the x-direction and the y-direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, a semiconductor on insulator (SeOI) layer, or the like.

The first and second horizontal conductive layers 102 and 104 may be stacked in order on the upper surface of the substrate 101. The first and second horizontal conductive layers 102 and 104 may be configured as source layers and may form a source structure SS together with the substrate 101. The source structure SS may function as a source line of the semiconductor device 100. As illustrated in FIG. 3B, the first horizontal conductive layer 102 may be directly connected to the channel layer 150 around the channel layer 150.

The first and second horizontal conductive layers 102, 104 may include a semiconductor material, such as, for example, polycrystalline silicon. In this case, at least the first horizontal conductive layer 102 may be a layer doped with impurities of the same conductivity type as that of the substrate 101. The second horizontal conductive layer 104 may be a doped layer or an intrinsic semiconductor layer including impurities diffused from the first horizontal conductive layer 102. However, the material of the second horizontal conductive layer 104 is not limited to a semiconductor material and may be replaced with an insulating layer in example embodiments. In example embodiments, a relatively thin insulating layer may be interposed between an upper surface of the first horizontal conductive layer 102 and a lower surface of the second horizontal conductive layer 104, and the insulating layer may be a first horizontal sacrificial layer 111 (see FIG. 9A) which may remain without being removed during the process of manufacturing the semiconductor device 100.

The gate electrodes 130 may be vertically stacked and spaced apart from each other on the source structure SS and may form a stack structure. For example, the gate electrodes 130 may include at least one lower gate electrode forming a gate of a ground select transistor, memory gate electrodes forming a plurality of memory cells, and upper gate electrodes forming gates of string select transistors. The number of the memory gate electrodes included in the memory cells may be determined depending on capacity of the semiconductor device 100. According to an example embodiment, the number of each of the upper and lower gate electrodes may be 1 to 4 or more and may have a structure the same as or different from the memory gate electrodes. Also, a portion of the gate electrodes 130, that is, for example, gate electrodes adjacent to the upper or lower gate electrode, may be dummy gate electrodes. The gate electrodes 130 may be isolated by the isolation regions MS by a predetermined unit in the y-direction.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be positioned alternately with the gate electrodes 130. Similar to the gate electrodes 130, the interlayer insulating layers 120 may be spaced apart from each other in a direction perpendicular to the upper surface of the source structure SS. The interlayer insulating layers 120 may include an insulating material such as silicon oxide or silicon nitride.

Each of the channel structures CH may form a memory cell string and may be spaced apart from each other on the substrate 101 while forming rows and columns. The channel structures CH form a grid pattern on the x-y plane or in a zigzag pattern in one direction. The channel structures CH may have a pillar shape filling the channel hole and may have an inclined side surface such that the width may decrease toward the substrate 101 depending on an aspect ratio.

The channel structures CH may include first and second channel structures CH1 and CH2 stacked vertically, but an example embodiment thereof is not limited thereto. The channel structures CH may have a shape in which the lower first channel structures CH1 and the upper second channel structures CH2 are connected to each other and may have a bent portion due to a difference in width in the connection region. The channel layer 150, the dielectric layer 140, and the filling insulating layer 160 may be connected to each other between the first channel structure CH1 and the second channel structure CH2. The channel pad layer 165 may be positioned only on an upper end of the second channel structure CH2. A relatively thick upper interlayer insulating layer 125 may be around an upper region of the first channel structure CH1. However, the shapes of the interlayer insulating layers 120 and the upper interlayer insulating layer 125 may be varied in the example embodiments.

As illustrated in FIGS. 3A and 3B, each of the channel structures CH may include a dielectric layer 140, a channel layer 150, and a filling insulating layer 160 stacked in order from the gate electrodes 130 and may further include a channel pad layer 165 in an upper portion. In the channel structures CH, relative thicknesses of the dielectric layer 140, the channel layer 150, and the filling insulating layer 160 may be varied. That is, the dielectric layer 140 may be on or adjacent a sidewall of the channel hole, the channel layer 150 may be on the dielectric layer 140 opposite the sidewall of the channel hole, and the filling insulating layer 160 may be on the channel layer 150 opposite the sidewall of the channel hole.

The dielectric layer 140 may be between the gate electrodes 130 and the channel layer 150 and may be configured in an annular shape in a channel hole in which the channel structure CH is disposed. The dielectric layer 140 may include a first dielectric layer 142 and a second dielectric layer 144 in order from the gate electrodes 130 and including different materials. That is, the second dielectric layer may be on the first dielectric layer opposite a sidewall of the channel hole. In example embodiments, the dielectric layer 140 may further include a dielectric layer extending along an upper surface, a bottom surface, and a side surface of each of the gate electrodes 130 and disposed between the gate electrodes 130 and the channel hole.

The first dielectric layer 142 may extend to an upper end and a lower end of the channel structure CH along the channel hole and may be on or cover an internal side surface and a bottom surface of the channel hole. The first dielectric layer 142 may be in a region other than a contact region between the first horizontal conductive layer 102 and the channel layer 150 in a channel hole. In the contact region, the dielectric layer 140 may be partially removed to expose the channel layer 150. The first dielectric layer 142 may be in contact with the gate electrodes 130 through an external side surface and may be in contact with the second dielectric layer 144 through an internal side surface. The first dielectric layer 142 may reduce a chance of or prevent carriers from moving to the second dielectric layer 144 and/or the gate electrodes 130 or may reduce or prevent material from diffusing. Accordingly, a polarization state in the second dielectric layer 144 may be stably maintained, and ferroelectric properties of the second dielectric layer 144 may be stably maintained.

The first dielectric layer 142 may be formed of an insulating material, such as, for example, silicon oxide (SiO), silicon nitride (SiN), silicon oxynitride (SiON), a high-k material, or a combination thereof. Here, the high-k material may refer to a dielectric material having a dielectric constant higher than that of silicon dioxide ($SiO_2$). The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), praseodymium oxide ($Pr_2O_3$), or combinations thereof. The first dielectric layer 142 may not include a ferroelectric material.

The second dielectric layer 144 may extend from the lower surface of the channel pad layer 165 to the lower end of the channel structure CH along the channel hole. The second dielectric layer 144 may be in a region other than a region in which channel pad layer 165 is positioned and the contact region in which the first horizontal conductive layer 102 and the channel layer 150 are in contact with each other within the channel hole. The upper surface or the upper end of the second dielectric layer 144 may be on a level lower than a level of the upper surface of the channel hole, the upper end of the first dielectric layer 142, and the upper surface of the channel pad layer 165, and may be on a level higher than a level of the upper surface of the uppermost gate electrode 130. The upper end of the second dielectric layer 144 may be on substantially the same level as a level of the upper end of the filling insulating layer 160. The upper surface of the second dielectric layer 144, the upper surface of the channel layer 150, and the upper surface of the filling insulating layer 160 may be on substantially the same level and may be substantially coplanar. An upper end of the second dielectric layer 144 may be covered by the channel pad layer 165 and may be in contact with the channel pad layer 165.

The second dielectric layer 144 may include a material different from that of the first dielectric layer 142. The hardness of the second dielectric layer 144 may be higher than that of the first dielectric layer 142 and the filling insulating layer 160. Accordingly, the second dielectric layer 144 may not be easily removed by a planarization process such as chemical mechanical polishing (CMP), which will be described in greater detail with reference to FIG. 9G below.

The second dielectric layer 144 may include at least one of a ferroelectric material or an anti-ferroelectric material. The second dielectric layer 144 may include, for example, at least one of hafnium (Hf), zirconium (Zr), silicon (Si), yttrium (Y), aluminum (Al), gadolinium (Gd), strontium (Sr), lanthanum (La), titanium (Ti), scandium (Sc), or oxides thereof. The second dielectric layer 144 may include one or more materials selected from a group consisting of hafnium oxide ($HfO_2$), zirconium oxide ($ZrO_2$), hafnium-zirconium oxide ($Hf_xZr_{1-x}O_2$, $0<x<1$), and combinations thereof as a base material, and may further include a dopant material selected from a group consisting of hafnium (Hf), zirconium (Zr), silicon (Si), yttrium (Y), aluminum (Al), gadolinium (Gd), strontium (Sr), lanthanum. (La), scandium (Sc) carbon (C), germanium (Ge), tin (Sn), lead (Pb), magnesium (Mg), calcium (Ca), barium (Ba), titanium (Ti), and combinations thereof. For example, the second dielectric layer 144 may include hafnium oxide doped with at least one of zirconium (Zr), silicon (Si), yttrium (Y), aluminum (Al), gadolinium (Gd), strontium (Sr), lanthanum (La), or scandium (Sc). The second dielectric layer 144 may have a crystalline structure. The second dielectric layer 144 may include a single layer or multiple layers including different materials. The thickness T1 of the second dielectric layer 144 may be in a range in which ferroelectric properties is obtained, that is, for example, in a range of about 1 nm to about 30 nm, and the thickness T1 may be varied depending on the type of material thereof.

When the second dielectric layer 144 includes a ferroelectric material, the second dielectric layer 144 may have a relatively large dielectric constant, and may form an electric dipole by ferroelectric polarization, which is spontaneous polarization. The second dielectric layer 144 may have remnant polarization due to the electric dipole even while there is no external electric field. When the second dielectric layer 144 includes an antiferroelectric material, the second dielectric layer 144 may have polarization properties while an external electric field is applied. For example, the semiconductor device 100 may be configured as a ferroelectric random access memory (FeRAM) which may write data using a polarization state of the second dielectric layer 144 which is a ferroelectric.

In some example embodiments, the second dielectric layer 144 may further include chlorine (Cl) in an upper region including an upper end in contact with the channel pad layer 165. The chlorine (Cl) may partially remain as a result of process of chlorine ($Cl_2$) cleaning described below with reference to FIG. 9F. The second dielectric layer 144 may not include chlorine (Cl) in a lower region including a lower portion.

The channel layer 150 may be between the dielectric layer 140 and the filling insulating layer 160, and may be configured in an annular shape in the channel hole. The channel layer 150 may extend from the lower surface of the channel pad layer 165 to the lower end of the channel structure CH along the channel hole. The channel layer 150 may not include a region covering the upper surface of the dielectric layer 140 on the bottom surface of the channel hole and extending horizontally, but an example embodiment thereof is not limited thereto. The channel layer 150 may be in contact with the first horizontal conductive layer 102 through an external side surface in the contact region including a region at a level corresponding to the first horizontal conductive layer 102. Accordingly, the channel layer 150 may be electrically connected to the source structure SS. In the example embodiment, the upper surface of the channel layer 150 may be on substantially the same level as a level of the upper surface of the second dielectric layer 144 and the upper surface of the filling insulating layer 160, and may be substantially coplanar therewith.

The channel layer 150 may include a polycrystalline or single-crystalline semiconductor material, such as, for example, silicon (Si) and/or germanium (Ge). In example embodiments, the semiconductor material of the channel layer 150 may have, for example, n-type conductivity by a doping element in at least one region, but an example embodiment thereof is not limited thereto. In some example embodiments, the channel layer 150 may include an oxide semiconductor material. In this case, the channel layer 150 may include, for example, an oxide including at least one of indium (In), zinc (Zn), or gallium (Ga), and may include, for example, at least one of zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), or indium gallium silicon oxide (InGaSiO).

The filling insulating layer 160 may fill an internal space of the channel layer 150 in the channel hole. However, the filling insulating layer 160 may not extend to the upper end of the channel structure CH and may extend to the lower surface of the channel pad layer 165. The entirety of the external side surface of the filling insulating layer 160 may be surrounded by the channel layer 150. A level of the upper surface of the filling insulating layer 160 may be higher than a level of the upper surface of the uppermost gate electrode 130.

The filling insulating layer 160 may include an insulating material. The filling insulating layer 160 may include a material the same as or different from that of the first dielectric layer 142 and may include a material different from that of the second dielectric layer 144. For example, the filling insulating layer 160 may include at least one of silicon oxide (SiO), silicon nitride (SiN), or silicon oxynitride (SiON).

The channel pad layer 165 may fill an internal space of the first dielectric layer 142 on an upper region including an upper end of the channel structure CH, that is, for example, on the second dielectric layer 144, the channel layer 150, and the filling insulating layer 160. The channel pad layer 165 may be in contact with the first dielectric layer 142 through a side surface and may be in contact with the second dielectric layer 144, the channel layer 150, and the filling insulating layer 160 through a lower surface. The upper surface of the channel pad layer 165 may be substantially coplanar with an upper surface of the first dielectric layer 142. The lower surface of the channel pad layer 165 may be on a level higher than a level of the upper surface of the uppermost gate electrode 130.

The channel pad layer 165 may include, for example, an n-type semiconductor layer. For example, the channel pad layer 165 may include silicon (Si), and may be configured as, for example, a polycrystalline silicon layer. The channel pad layer 165 may include the same material as that of the channel layer 150, but an example embodiment thereof is not limited thereto. In some example embodiments, in the channel pad layer 165, an outermost region along an outer circumferential surface of the channel hole, for example, the region including the side surface, may be formed with the channel layer 150 or may be configured as a layer extending from the channel layer 150. In this case, when the channel pad layer 165 and the channel layer 150 are formed of the same material, the layer extending from the channel layer 150 in the channel pad layer 165 may not be distinct from the other region of the channel pad layer 165.

The upper isolation regions US may extend in the x-direction between the isolation regions MS adjacent to each other in the y-direction. The upper isolation regions US may be extend through a portion of the gate electrodes 130 including uppermost gate electrodes 130 of the gate electrodes 130. As illustrated in FIG. 2, the upper isolation regions US may isolate, for example, three gate electrodes 130 from each other in the y-direction. However, the number of gate electrodes 130 isolated by the upper isolation regions US may be varied in example embodiments. The upper isolation regions US may include an upper isolation insulating layer 103. The upper isolation insulating layer 103 may include an insulating material, such as, for example, silicon oxide, silicon nitride, or silicon oxynitride.

The isolation regions MS may extend through the gate electrodes 130, the interlayer insulating layers 120, and the first and second horizontal conductive layers 102 and 104, and may extend in the x-direction, and may be connected to the substrate. 101. As illustrated in FIG. 1, the isolation regions MS may be positioned in parallel to each other. The isolation regions MS may isolate the gate electrodes 130 from each other along the y-direction. The isolation regions MS may have a shape of which a width may decrease toward the substrate 101 due to a high aspect ratio. The isolation regions MS may include an isolation insulating layer 105 in the trench. The isolation insulating layer 105 may include an insulating material, such as, for example, silicon oxide, silicon nitride, or silicon oxynitride.

The contact plugs 170 may be on the channel structures CH. The contact plugs 170 may have a cylindrical shape and may have a side surface inclined such that a width thereof may decrease toward the substrate 101 depending on an aspect ratio. The contact plugs 170 may connect the channel structures CH to the interconnection lines 180. The interconnection lines 180 may be connected to the contact plugs 170 and may be bit lines of the semiconductor device 100 or may be an interconnection structure electrically connected to the bit lines.

The contact plugs 170 and the interconnection lines 180 may be formed of a conductive material, and may include, for example, at least one of tungsten (W), aluminum (Al), or copper (Cu).

The cell region insulating layer 190 may include first and second cell region insulating layers 192 and 194 stacked in the z direction. The first and second cell region insulating layers 192 and 194 may cover the gate electrodes 130 and the channel structures CH. In example embodiments, each of the first and second cell region insulating layers 192 and 194 may include a plurality of insulating layers. The first and second cell region insulating layers 192 and 194 may be formed of an insulating material, and may include, for example, at least one of silicon oxide, silicon nitride, or silicon oxynitride.

Figure 4A:
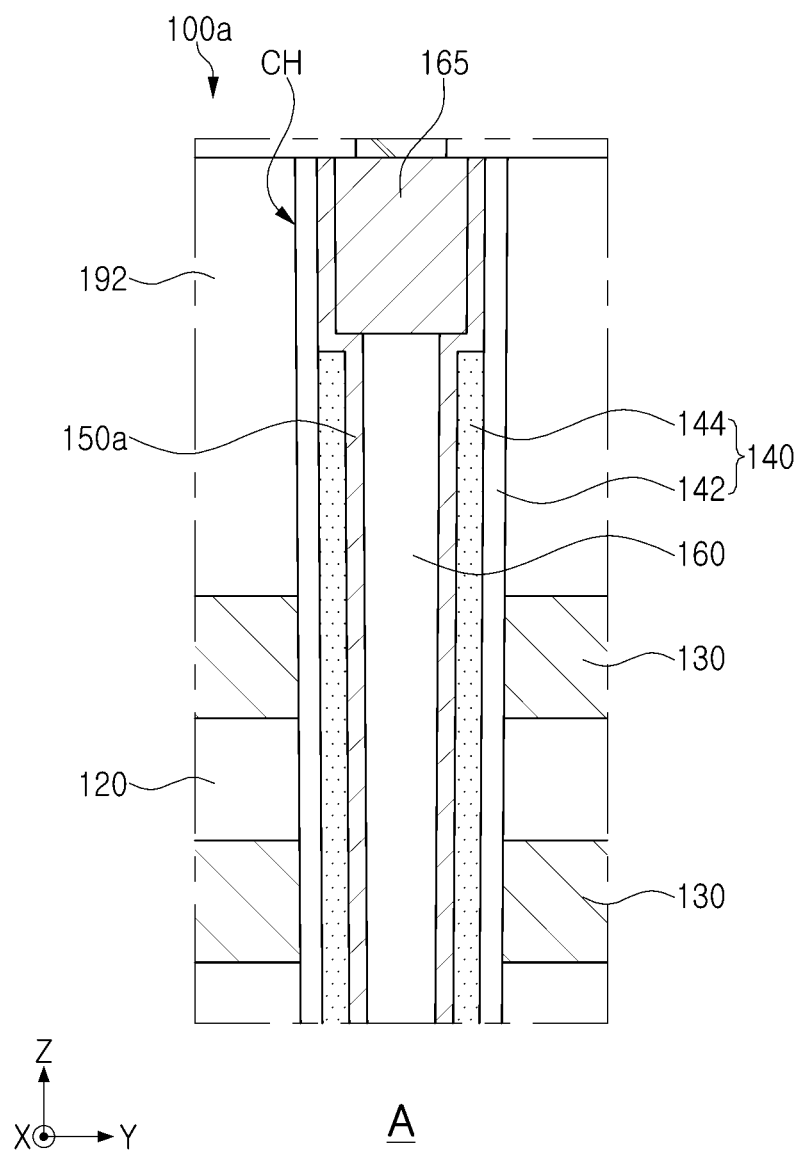
FIGS. 4A to 4C are enlarged views illustrating a portion of a semiconductor device according to an example embodiment of the present disclosure.
Figure 4B:
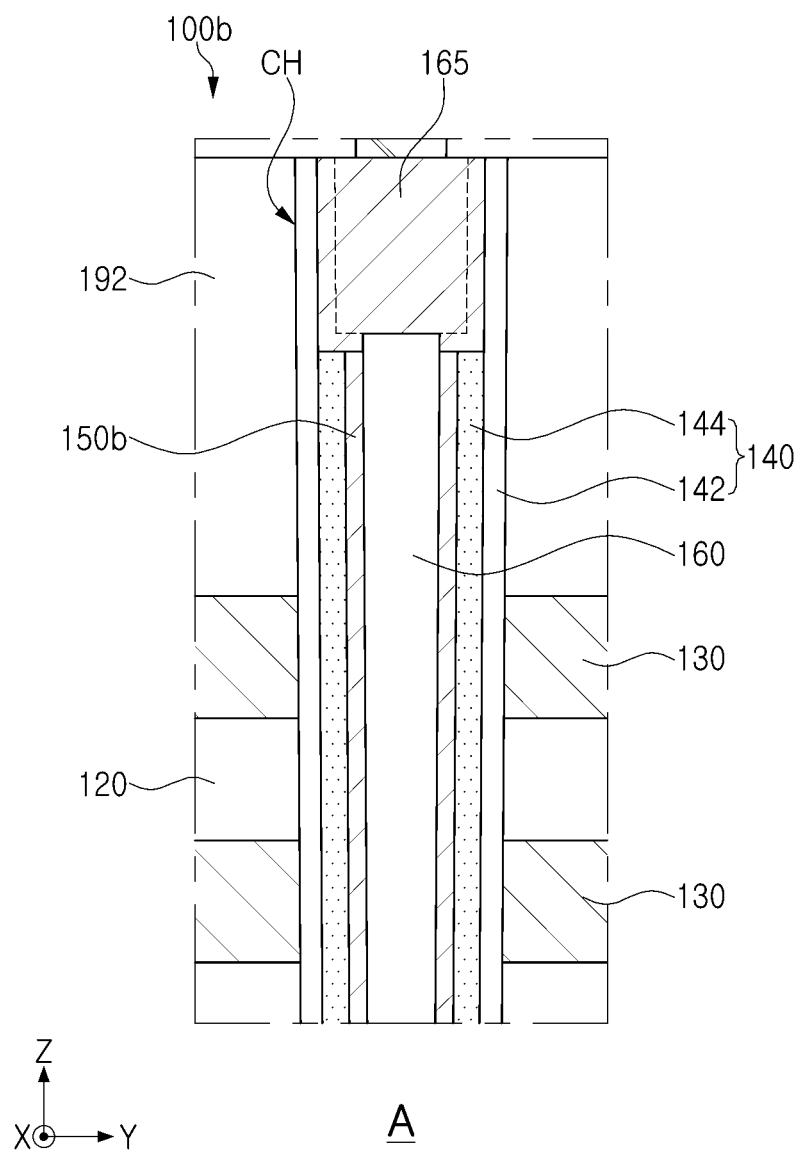
Figure 4C:
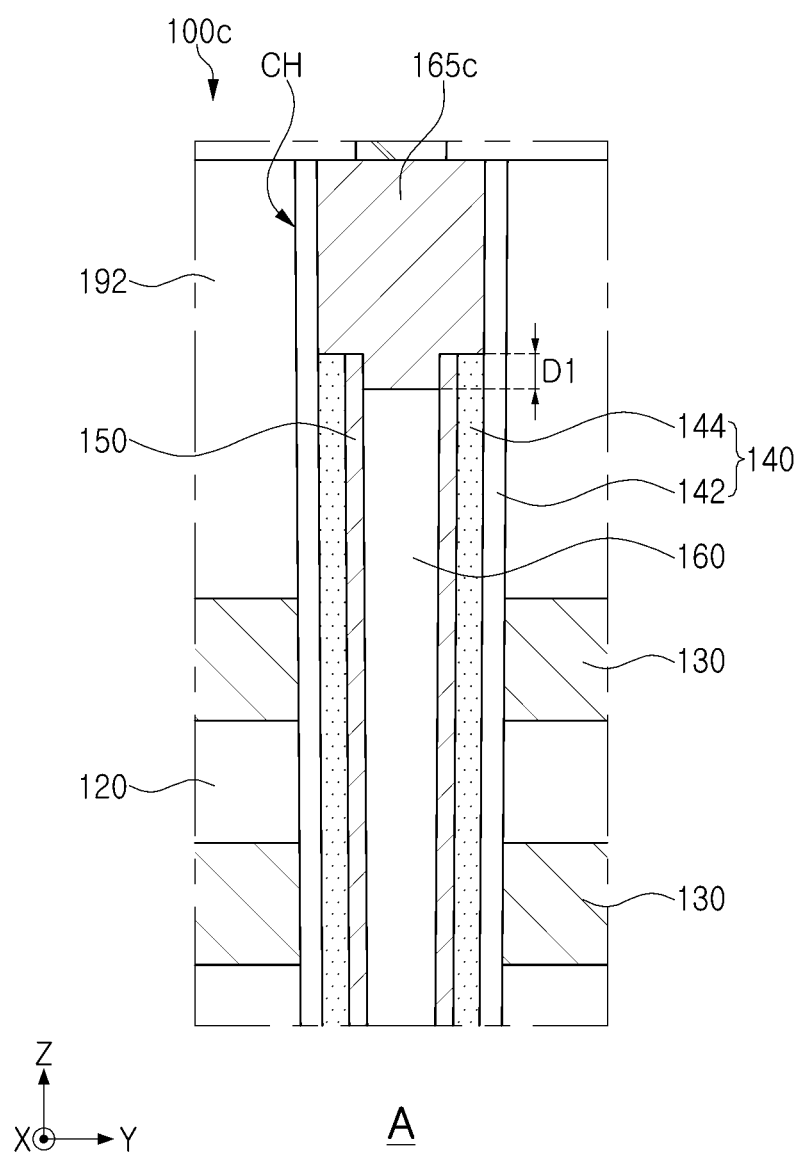

FIGS. 4A to 4C are enlarged views illustrating a portion of a semiconductor device according to an example embodiment, illustrating a region corresponding to region "A" in FIG. 2.

Referring to FIG. 4A, in the channel structure CH of the semiconductor device 100a, the arrangement of the channel layer 150a may be different from the example embodiment in FIGS. 1 to 3B.

The channel layer 150a may cover the side surface of the channel pad layer 165 and may extend to an upper end of the channel structure CH. The channel layer 150a may cover the upper surface of the second dielectric layer 144 and may be bent to extend upwardly. In the example embodiment, the channel layer 150a may include a material or a composition different from that of the channel pad layer 165, and an interfacial surface therebetween may be distinct.

The channel pad layer 165 may fill an internal side of the channel layer 150a, and the upper surface of the channel pad layer 165 may be substantially coplanar with the upper surface of the channel layer 150a and the upper surface of the first dielectric layer 142. A lower surface of the channel pad layer 165 may be in contact with the filling insulating layer 160. The level of the upper surface of the filling insulating layer 160 may be higher than the level of the upper surface of the second dielectric layer 144, but an example embodiment thereof is not limited thereto.

In some example embodiments, the channel layer 150a may be in a form in which a lower region in contact with the second dielectric layer 144 and an upper region on the upper surface of the second dielectric layer 144 may be spaced apart from each other.

Referring to FIG. 4B, in the channel structure CH of the semiconductor device 100b, the channel layer 150b may be formed of the same material as that of the channel pad layer 165, differently from in the example embodiment in FIG. 4A. In this case, the interfacial surface between the channel layer 150b and the channel pad layer 165, marked by a dotted line in FIG. 4B, may not be distinct. However, a region on the second dielectric layer 144 in the channel layer 150b may be referred to as a channel pad layer 165. As for the other components, the descriptions described with reference to FIG. 4A may be applied. In the example embodiment in FIG. 4A and the present example embodiment, the channel layers 150a and 150b may cover the entirety of the upper surface of the second dielectric layer 144 in the lower end of the channel hole.

Referring to FIG. 4C, in the channel structure CH of the semiconductor device 100c, the arrangement of the channel pad layer 165c may be different from that in the example embodiment in FIGS. 1 to 3B.

The channel pad layer 165c may partially fill an internal side of the channel layer 150 and may extend downwardly from the upper surface of the channel layer 150 to a first depth D1. In example embodiments, the range of the first depth D1 is not limited to the example illustrated in FIG. 4C and may be varied within a range in which the channel pad layer 165c is on the uppermost gate electrode 130. The level of the lower surface of the channel pad layer 165c may be on a level lower than the level of the upper surfaces of the second dielectric layer 144 and the channel layer 150.

FIGS. 5A to 5D are enlarged views illustrating a portion of a semiconductor device according to an example embodiment, illustrating a region corresponding to region "A" in FIG. 2.

Figure 5A:
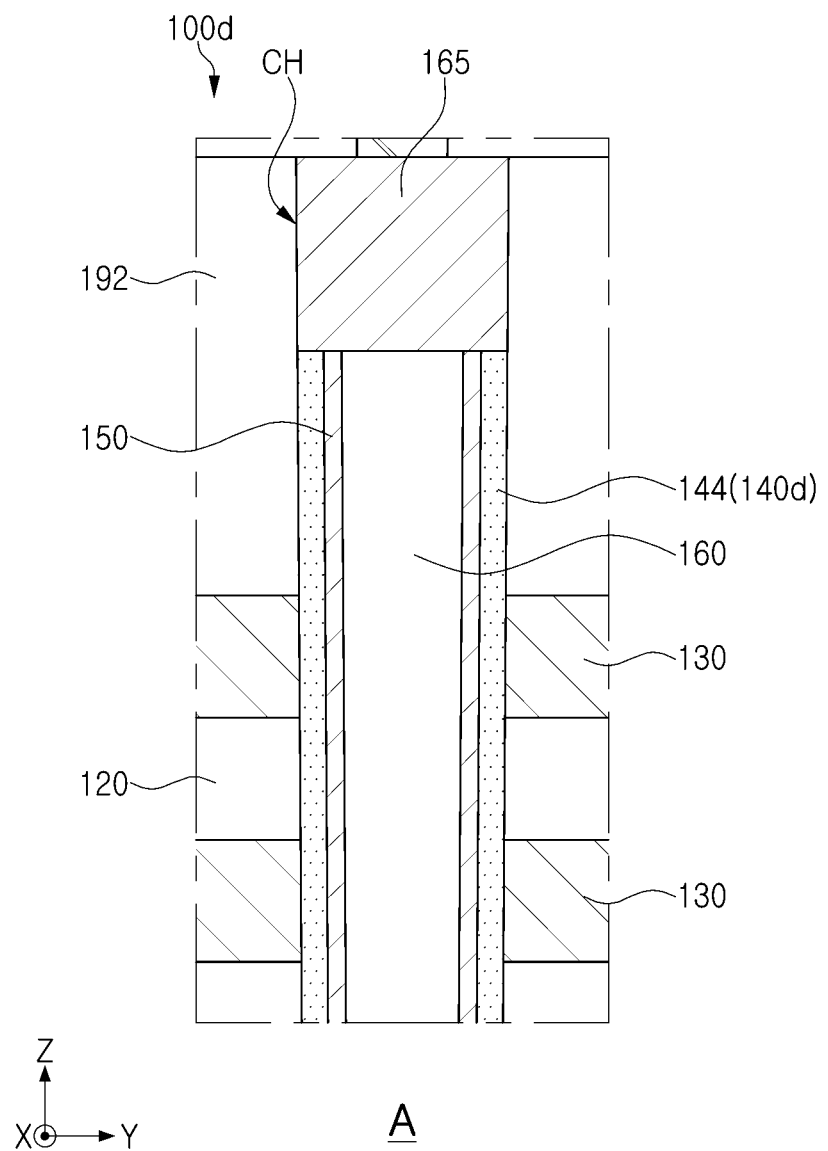
FIGS. 5A to 5D are enlarged views illustrating a portion of a semiconductor device according to an example embodiment of the present disclosure.

Referring to FIG. 5A, in the channel structure CH of the semiconductor device 100d, the dielectric layer 140d may not include the first dielectric layer 142 (see FIG. 3A) and may only include the second dielectric layer 144. The second dielectric layer 144 may be in contact with the first cell region insulating layer 192, the interlayer insulating layers 120, and the gate electrodes 130 and may extend in the z direction.

Figure 5B:
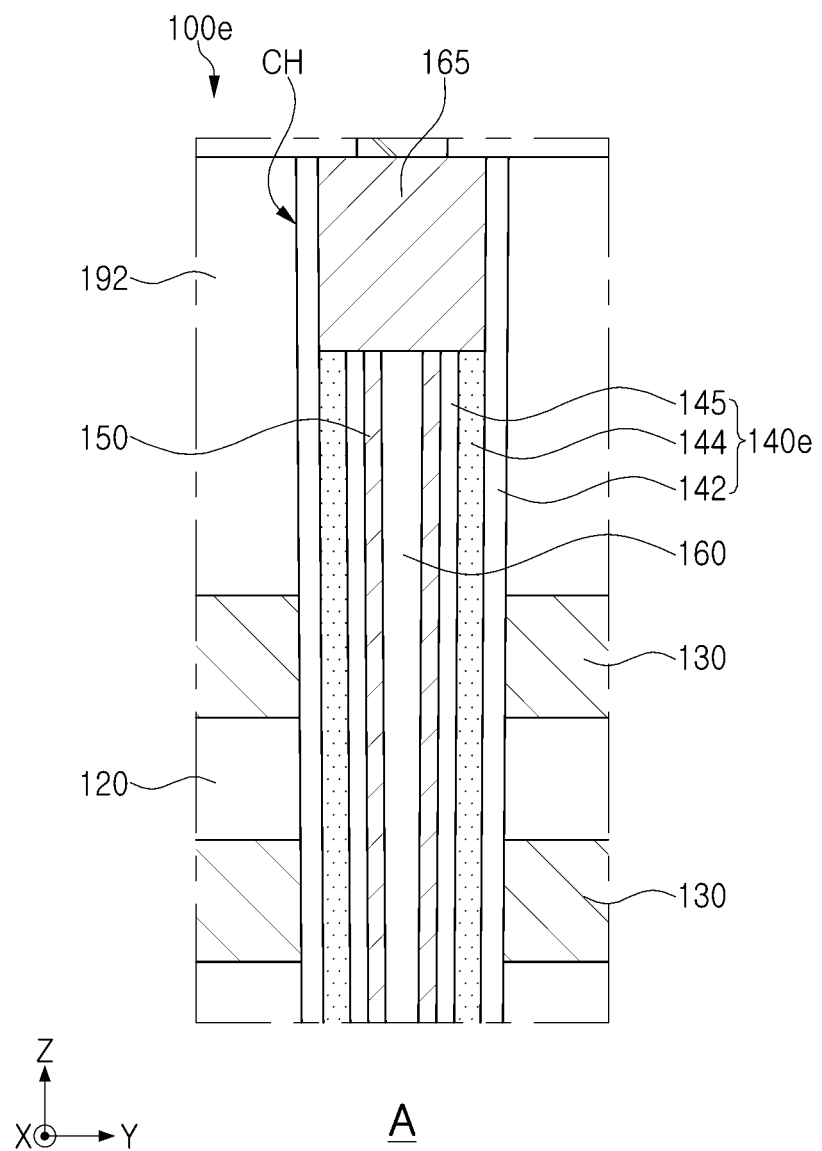

Referring to FIG. 5B, in the channel structure CH of the semiconductor device 100e, the dielectric layer 140e may further include a third dielectric layer 145.

The third dielectric layer 145 may be between the second dielectric layer 144 and the channel layer 150. The third dielectric layer 145 may reduce a chance of or prevent carriers from moving from the channel layer 150 to the second dielectric layer 144. Accordingly, the polarization state in the second dielectric layer 144 may be more stably maintained. In example embodiments, the relative thicknesses of the first to third dielectric layers 142, 144, and 145 may be varied.

Figure 5C:
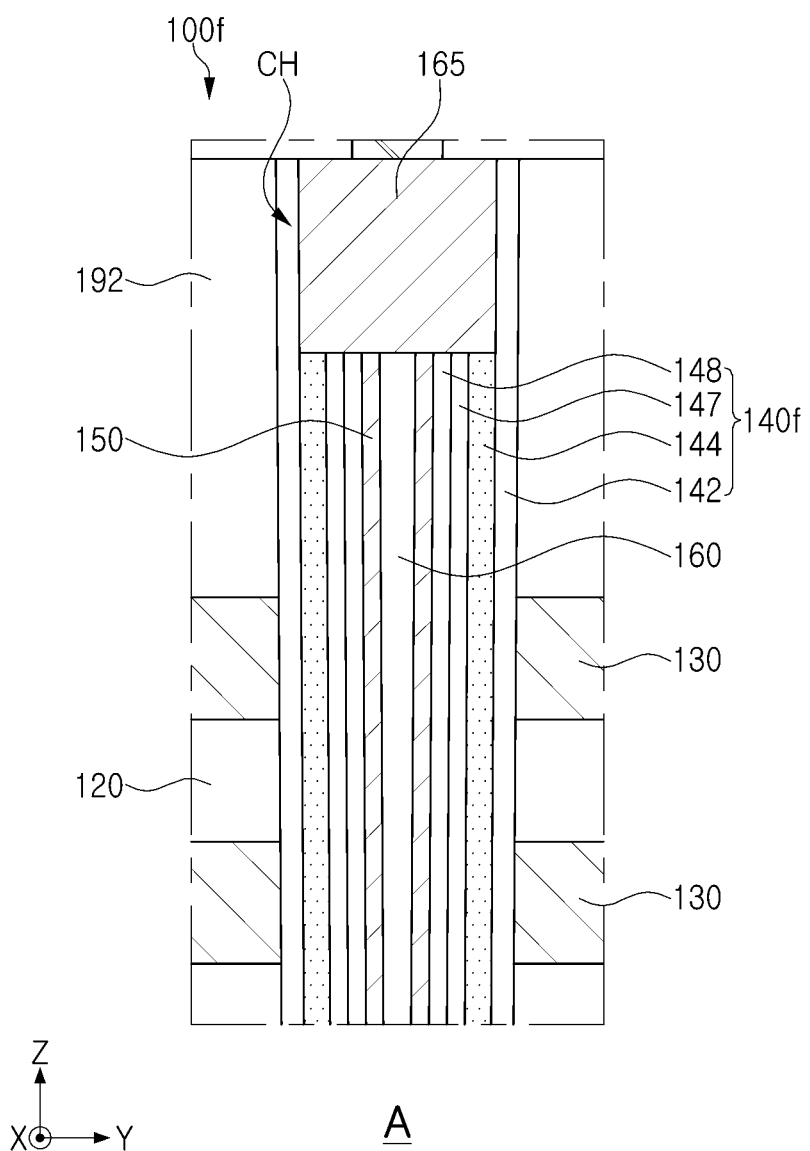

Referring to FIG. 5C, in the channel structure CH of the semiconductor device 100f, the dielectric layer 140f may further include a charge storage layer 147 and a tunneling layer 148.

The charge storage layer 147 may be configured as a charge trap layer or a floating gate conductive layer. The charge storage layer 147 may include silicon nitride (SiN) or polycrystalline silicon. The tunneling layer 148 may tunnel carriers from the channel layer 150 to the charge storage layer 147, and may include, for example, silicon oxide ($SiO_2$), silicon nitride ($Si_3N_4$), silicon oxynitride (SiON), or combinations thereof. Accordingly, the semiconductor device 100f in the example embodiment may be implemented as a NAND flash memory in which data is written by storing electric charges in the charge storage layer 147.

In the example embodiment, the first dielectric layer 142 may function as a blocking layer and may reduce or prevent loss of electrons stored in the charge storage layer 147 together with the second dielectric layer 144. In some example embodiments, the first dielectric layer 142 may not be provided. In the example embodiment, the second dielectric layer 144 may be configured to reduce a program voltage during a program operation of the semiconductor device 100f, but the function of the second dielectric layer 144 is not limited thereto.

Figure 5D:
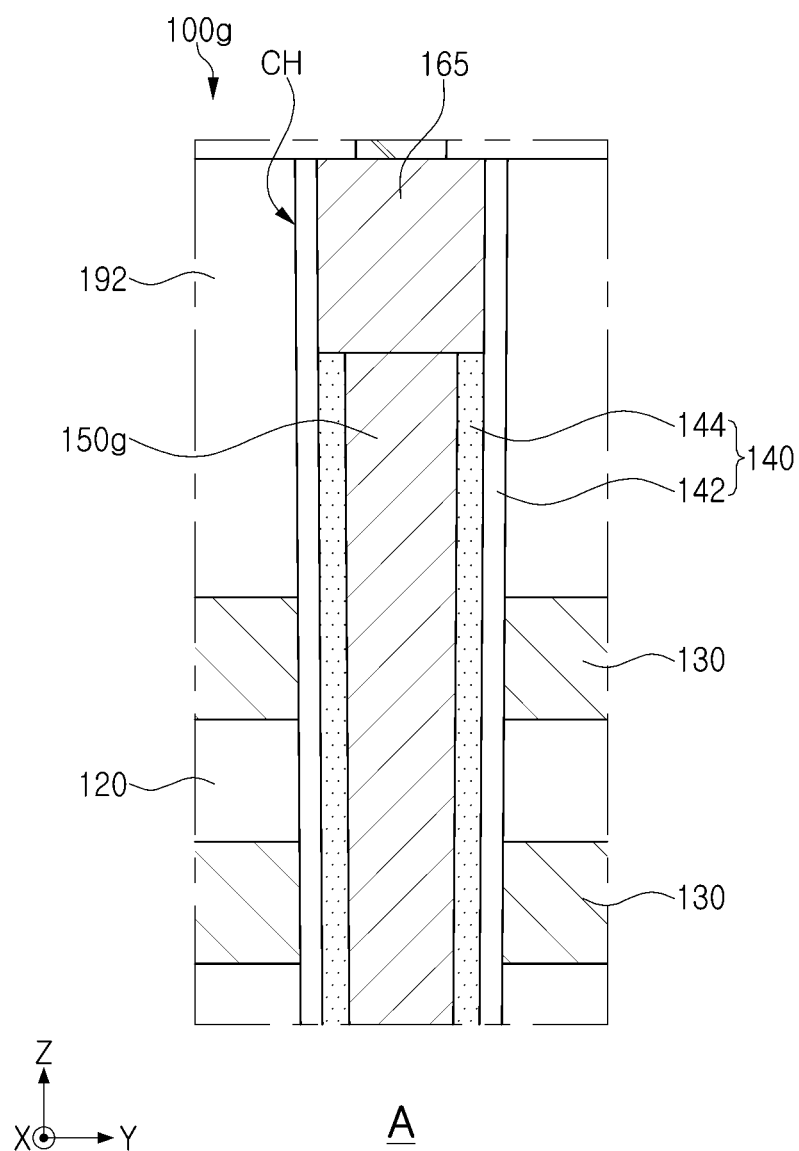

Referring to FIG. 5D, in the channel structure CH of the semiconductor device 100g, the filling insulating layer 160 (see FIG. 3A) may not be provided. Accordingly, the channel layer 150g may be fill the channel hole in an internal side of the second dielectric layer 144.

Figure 6:
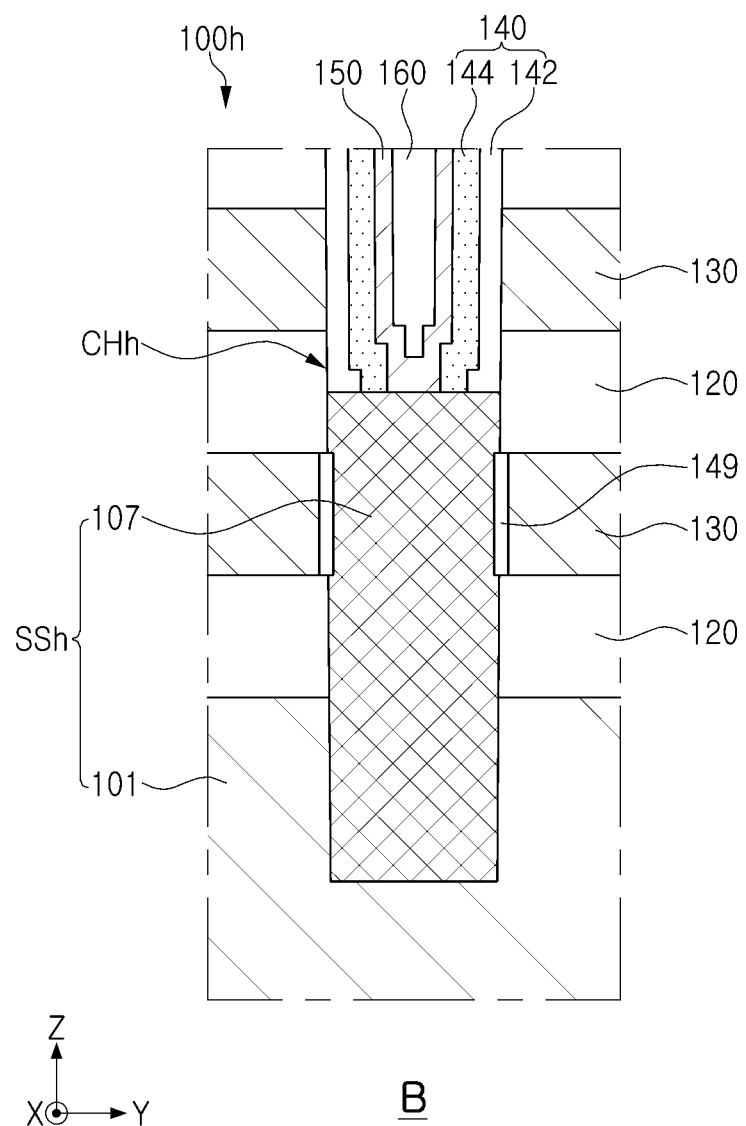
FIG. 6 is an enlarged view illustrating a portion of a semiconductor device according to an example embodiment of the present disclosure.

FIG. 6 is an enlarged view illustrating a portion of a semiconductor device according to an example embodiment, illustrating a region corresponding to region "B" in FIG. 2.

Referring to FIG. 6, the semiconductor device 100h may not include the first and second horizontal conductive layers 102 and 104 on the substrate 101, differently from in the example embodiment in FIGS. 1 and 3B. Also, the source structure SSh may further include an epitaxial layer 107 below the channel structure CHh in addition to the substrate 101.

The epitaxial layer 107 may be on the substrate 101 below the channel structure CHh and may be on the side surface of the at least one gate electrode 130 including the lowermost gate electrode 130. The epitaxial layer 107 may be in the recessed region of the substrate 101. The level of the upper surface of the epitaxial layer 107 may be higher than the level of the upper surface of the lowermost gate electrode 130 and lower than the level of the lower surface of the upper gate electrode 130, but an example embodiment thereof is not limited thereto. The epitaxial layer 107 may be connected to the lower surface of the channel layer 150 through the upper surface.

The lower end of the dielectric layer 140 may be on the upper surface of the epitaxial layer 107. A gate insulating layer 149 may be further positioned between the epitaxial layer 107 and the lowermost gate electrode 130 adjacent thereto. The shape of the channel structure CHh and the source structure SSh may be applied to the other example embodiments. Also, the example embodiments in FIGS. 4A to 6 may be combined with each other, unless otherwise indicated.

Figure 7:
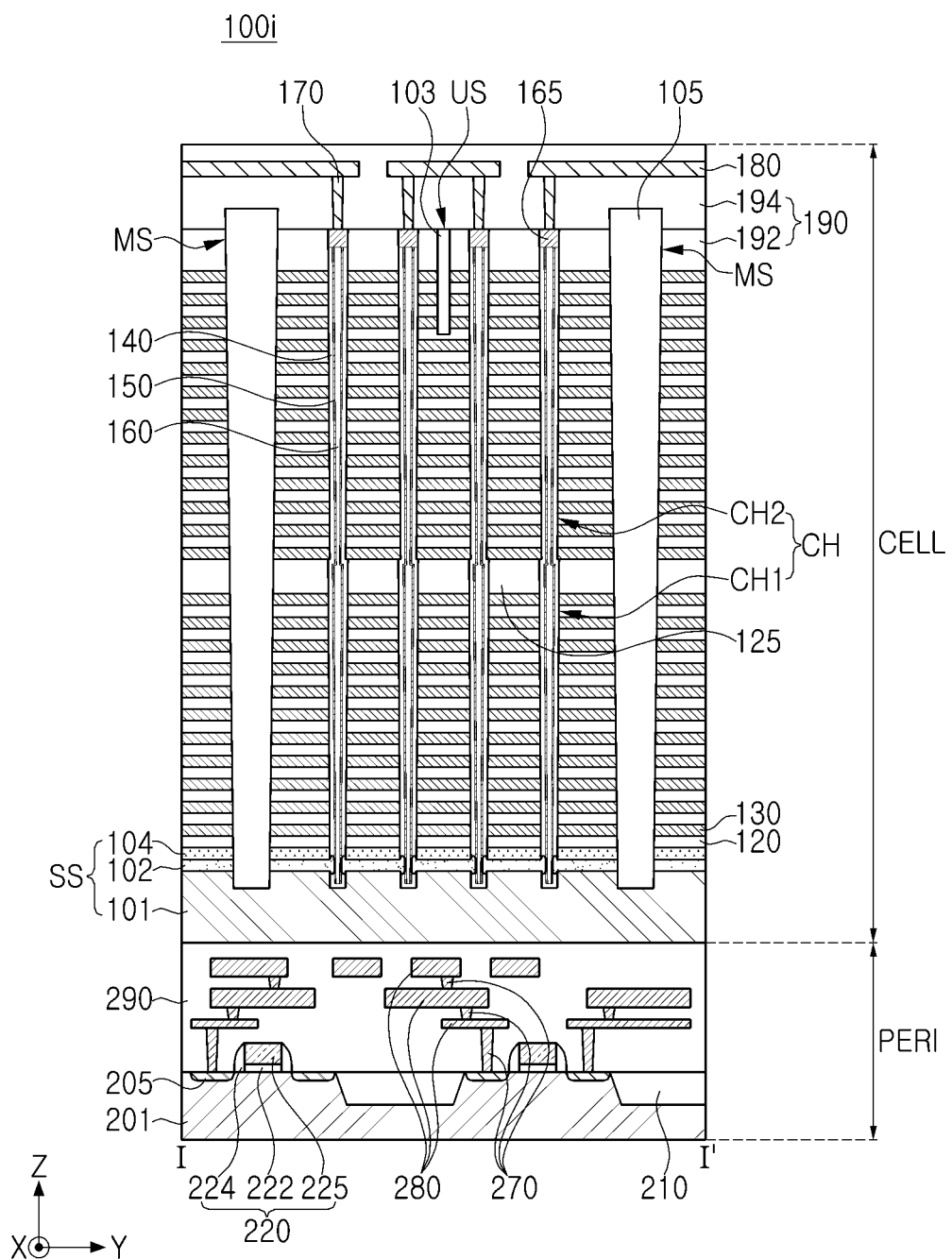
FIG. 7 is a cross-sectional view illustrating a semiconductor device according to an example embodiment of the present disclosure.

FIG. 7 is a cross-sectional view illustrating a semiconductor device according to an example embodiment.

Referring to FIG. 7, a semiconductor device 100i may include a memory cell region CELL and a peripheral circuit region PERI stacked vertically. The memory cell region CELL may be on the peripheral circuit region PERI. For example, in the case of the semiconductor device 100 in FIG. 2, the peripheral circuit region PERI may be on the substrate 101 in an unillustrated region, or as in the semiconductor device 100i in the example embodiment, the peripheral circuit region PERI may be below the substrate 101. In example embodiments, the cell region CELL may be below the peripheral circuit region PERI. As for the description of the memory cell region CELL, the same description described with reference to FIGS. 1 to 3B may be applied.

The peripheral circuit region PERI may include a base substrate 201, circuit devices 220 on the base substrate 201, circuit contact plugs 270, and circuit interconnection lines 280.

The base substrate 201 may have an upper surface extending in the x-direction and the y-direction. Device isolation layers 210 may be formed on the base substrate 201 and may define an active region. Source/drain regions 205 including impurities may be in a portion of the active region. The base substrate 201 may include a semiconductor material, such as, for example, a group IV semiconductor, a group III-V compound semiconductor, or a group II-VI compound semiconductor. The base substrate 201 may be provided as a bulk wafer or an epitaxial layer. In the example embodiment, the upper substrate 101 may be provided as a polycrystalline semiconductor layer such as a polycrystalline silicon layer, or an epitaxial layer.

The circuit devices 220 may include a horizontal transistor. Each of the circuit devices 220 may include a circuit gate dielectric layer 222, a spacer layer 224, and a circuit gate electrode 225. The source/drain regions 205 may be in the base substrate 201 on both sides of the circuit gate electrode 225.

A peripheral region insulating layer 290 may be on the circuit device 220 on the base substrate 201. The circuit contact plugs 270 may extend through the peripheral region insulating layer 290 and may be connected to the source/drain regions 205. An electrical signal may be applied to the circuit device 220 by the circuit contact plugs 270. In a region not illustrated, circuit contact plugs 270 may also be connected to the circuit gate electrode 225. The circuit interconnection lines 280 may be connected to the circuit contact plugs 270 and may be arranged in a plurality of layers.

In the semiconductor device 200, after the peripheral circuit region PERI may be preferentially manufactured, and the substrate 101 of the memory cell region CELL may be formed thereon and the memory cell region CELL may be manufactured. The substrate 101 may have the same size as that of the base substrate 201 or may have a size smaller than that of the base substrate 201. The memory cell region CELL and the peripheral circuit region PERI may be connected to each other in a region not illustrated. For example, one end of the gate electrode 130 in the y-direction may be electrically connected to the circuit devices 220. As described above, the form in which the memory cell region CELL and the peripheral circuit region PERI are vertically stacked may be applied to the other example embodiments.

Figure 8:
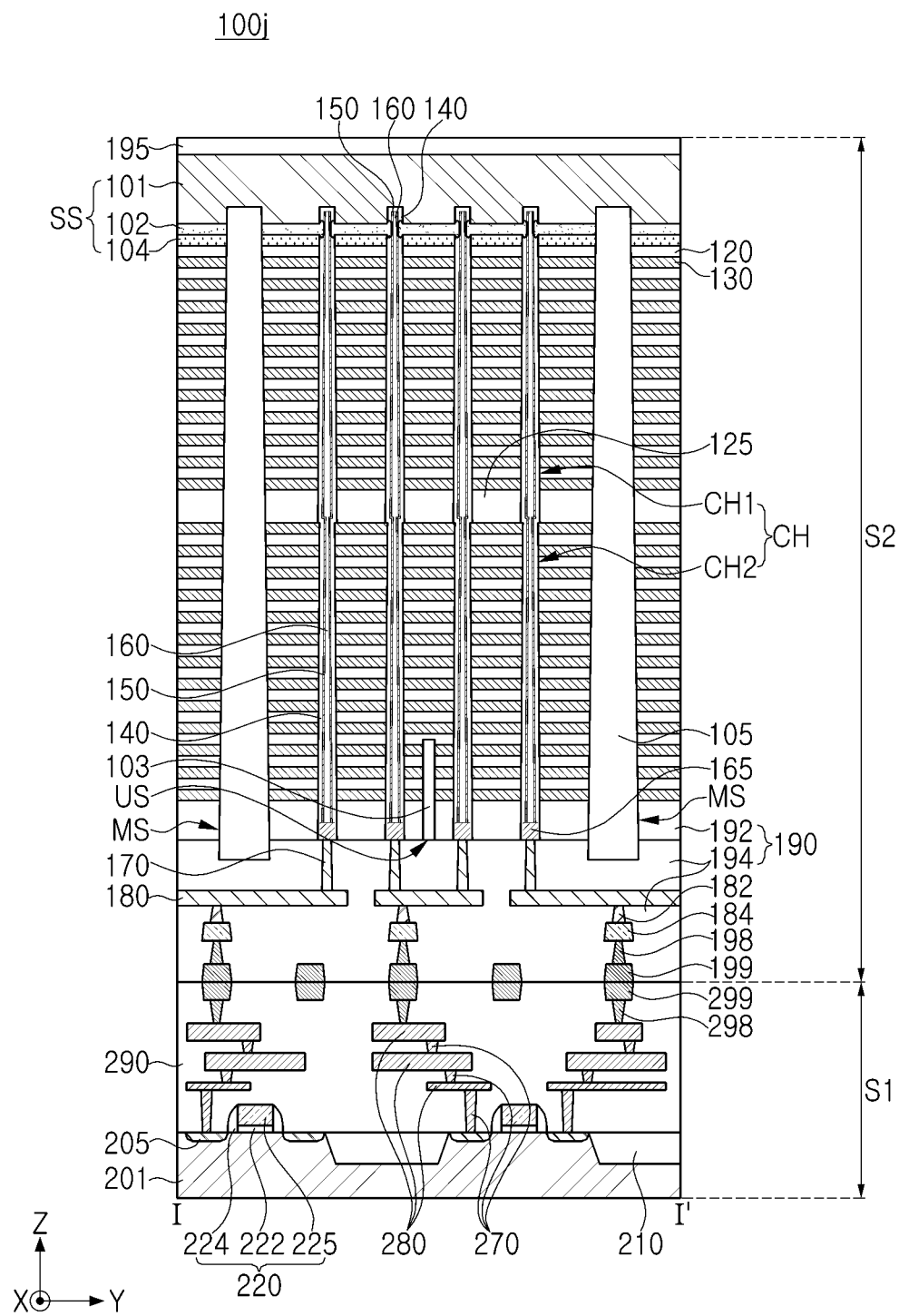
FIG. 8 is a cross-sectional view illustrating a semiconductor device according to an example embodiment of the present disclosure.

FIG. 8 is a cross-sectional view illustrating a semiconductor device according to an example embodiment.

Referring to FIG. 8, a semiconductor device 100j may include a first semiconductor structure S1 and a second semiconductor structure S2 bonded to each other by a wafer bonding method.

The description of the peripheral circuit region PERI described above with reference to FIG. 7 may be applied to the first semiconductor structure S1, but the first semiconductor structure S1 may further include first bonding vias 298 and first bonding pads 299 which may be bonding structures. The first bonding vias 298 may be on the uppermost circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 may provide an electrical connection path according to the bonding between the first semiconductor structure S1 and the second semiconductor structure S2 together with the second bonding pads 199. The first bonding vias 298 and the first bonding pads 299 may include a conductive material, such as, for example, copper (Cu).

As for the second semiconductor structure S2, the descriptions described with reference to FIGS. 1 to 3B may be applied unless otherwise indicated. The second semiconductor structure S2 may further include lower contact plugs 182 and lower interconnection lines 184 which may be interconnection structures and may further include second bonding vias 198 and second bonding pads 199 that are bonding structures. The second semiconductor structure S2 may further include a protective layer 195 covering the upper surface of the substrate 101.

The lower contact plugs 182 may be below the interconnection lines 180 and may connect the interconnection lines 180 and the lower interconnection lines 184 to each other. However, in example embodiments, the number of layers and the arrangement of the contact plugs and the interconnection lines included in the interconnection structure may be varied. The lower contact plugs 182 and the lower interconnection lines 184 may be formed of a conductive material, and may include, for example, at least one of tungsten (W), aluminum (Al), or copper (Cu).

The second bonding vias 198 and the second bonding pads 199 may be below the lowermost lower interconnection lines 184. The second bonding vias 198 may be connected to the interconnection lines 180 and the second bonding pads 199, and the second bonding pads 199 may be bonded to the first bonding pads 299 of the first semiconductor structure S1. The second bonding vias 198 and the second bonding pads 199 may include a conductive material, such as, for example, copper (Cu).

The first semiconductor structure S1 and the second semiconductor structure S2 may be bonded to each other by copper (Cu)-to-copper (Cu) bonding by the first bonding pads 299 and the second bonding pads 199. In addition to the copper (Cu)-to-copper (Cu) bonding, the first semiconductor structure S1 and the second semiconductor structure S2 may be additionally bonded by dielectric-to-dielectric bonding. The dielectric-to-dielectric bonding may form a portion of each of the peripheral region insulating layer 290 and the cell region insulating layer 190, and may be bonding by dielectric layers surrounding each of the first bonding pads 299 and the second bonding pads 199. Accordingly, the first semiconductor structure S1 and the second semiconductor structure S2 may be bonded to each other without a separate adhesive layer.

FIGS. 9A to 9M are cross-sectional views illustrating a method of manufacturing a semiconductor device according to an example embodiment. Each of FIGS. 9A, 9B, and 9K to 9M illustrates a region corresponding to the region illustrated in FIG. 2, and each of FIGS. 9C to 9J illustrates a region corresponding to region "C" in FIG. 9B.

Figure 10:
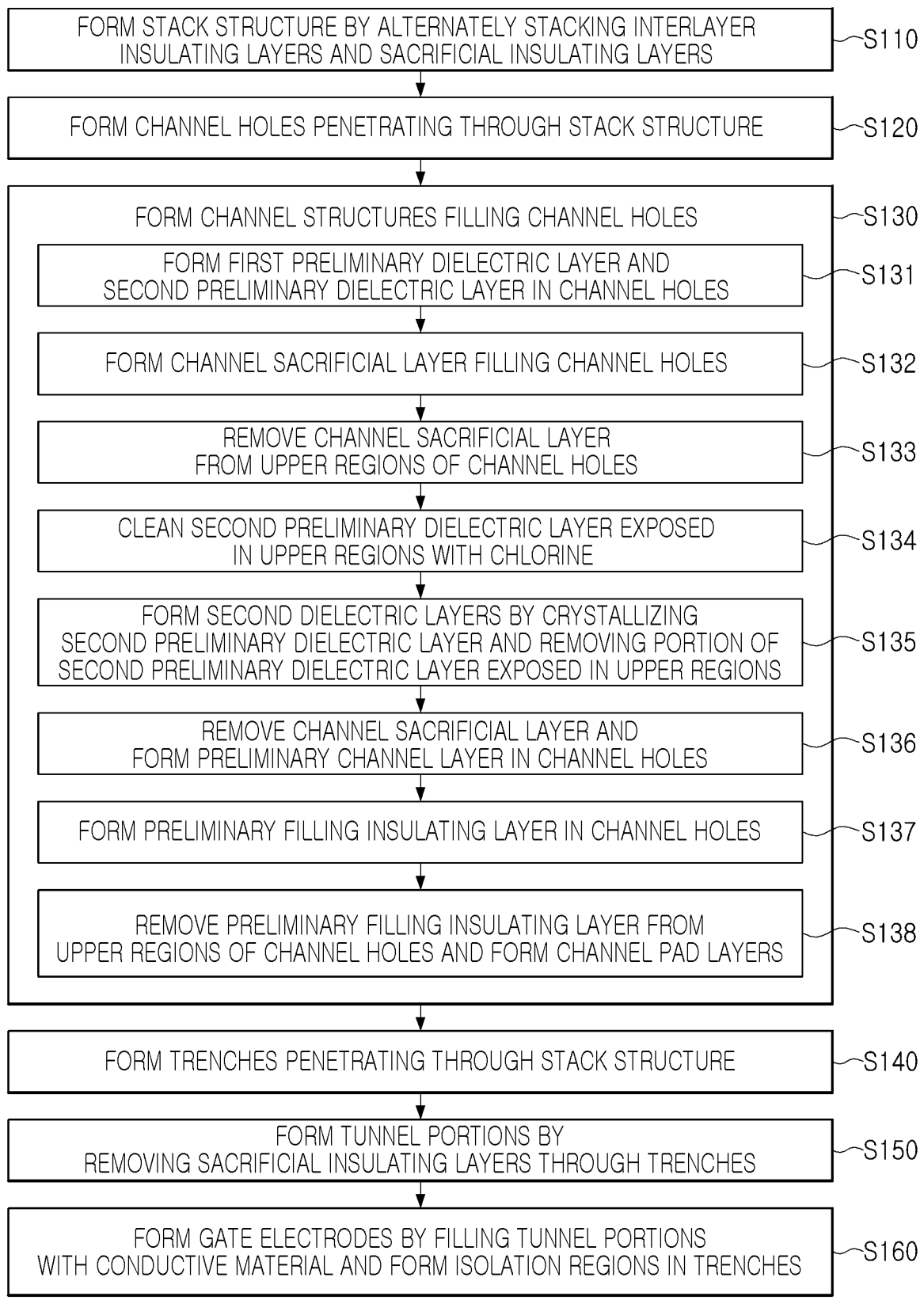
FIG. 10 is a flowchart illustrating a method of manufacturing a semiconductor device according to an example embodiment of the present disclosure.

FIG. 10 is a flowchart illustrating a method of manufacturing a semiconductor device according to an example embodiment.

Figure 9A:
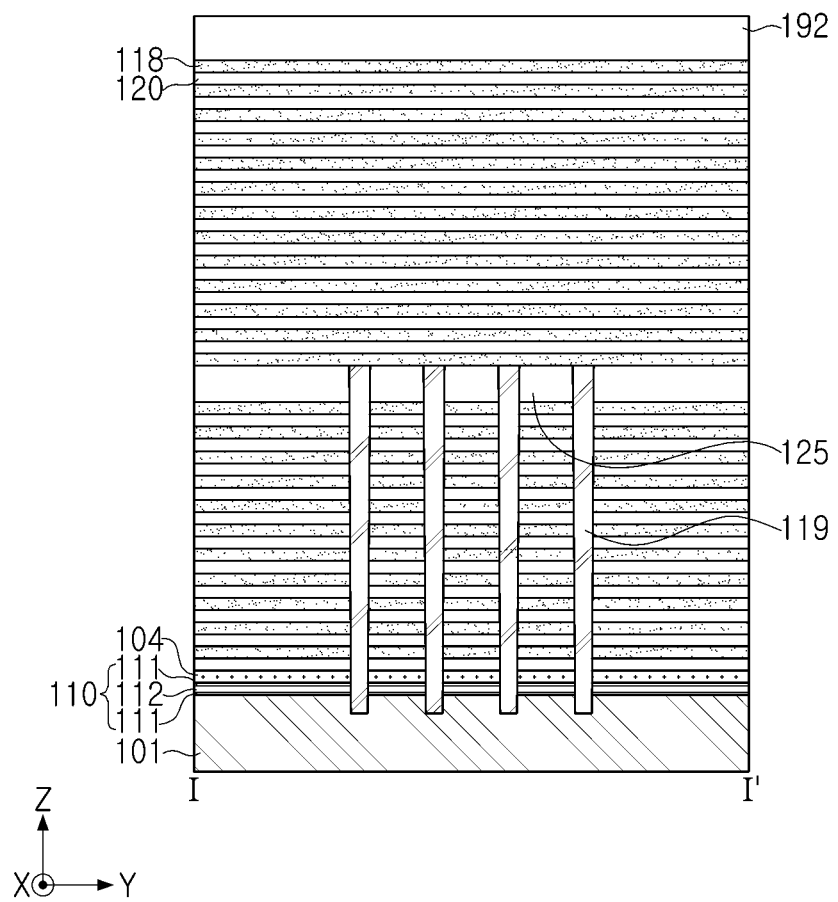
FIGS. 9A to 9M are cross-sectional views illustrating a method of manufacturing a semiconductor device according to an example embodiment of the present disclosure.

Referring to FIGS. 9A and 10, a horizontal sacrificial structure 110 and a second horizontal conductive layer 104 may be formed on a substrate 101, and the sacrificial insulating layers 118 and the interlayer insulating layers 120 may be alternately stacked and may form a stack structure (S110).

The horizontal sacrificial structure 110 may include first and second horizontal sacrificial layers 111 and 112. The first and second horizontal sacrificial layers 111 and 112 may be stacked on the substrate 101 such that the first horizontal sacrificial layers 111 may be above and below the second horizontal sacrificial layer 112. The first and second horizontal sacrificial layers 111 and 112 may include different materials. The first and second horizontal sacrificial layers 111 and 112 may be replaced with the first horizontal conductive layer 102 (see FIG. 2) through a subsequent process. For example, the first horizontal sacrificial layer 111 may be formed of the same material as that of the interlayer insulating layers 120, and the second horizontal sacrificial layer 112 may be formed of the same material as that of the sacrificial insulating layers 118. The second horizontal conductive layer 104 may be formed on the first and second horizontal sacrificial layers 111 and 112.

The sacrificial insulating layers 118 may be partially replaced by the gate electrodes 130 (see FIG. 2) through a subsequent process. The sacrificial insulating layers 118 may be formed of a material different from that of the interlayer insulating layers 120 and may be formed of a material etched with etching selectivity with respect to the interlayer insulating layers 120 under specific etching conditions. For example, the interlayer insulating layer 120 may be formed of at least one of silicon oxide or silicon nitride, and the sacrificial insulating layers 118 may be formed of a material different from that of the interlayer insulating layer 120, selected from at least one of silicon, silicon oxide, silicon carbide, and silicon nitride. In example embodiments, the thicknesses of the interlayer insulating layers 120 may not be the same. The thicknesses of the interlayer insulating layers 120 and the sacrificial insulating layers 118 and the number of films included in the interlayer insulating layers 120 and the sacrificial insulating layers 118 may be varied from the illustrated examples.

After forming a lower region of the stack structure of the sacrificial insulating layers 118 and the interlayer insulating layers 120, vertical sacrificial layers 119 may be formed and an upper region of the stack structure may be formed. The vertical sacrificial layers 119 may be formed in a region corresponding to the first channel structures CH1 of FIG. 2. The vertical sacrificial layers 119 are formed by forming lower channel holes in the lower region of the stack structure, depositing a material forming the vertical sacrificial layers 119 in the lower channel holes, and performing a planarization process. The vertical sacrificial layers 119 may include a material different from those of the interlayer insulating layers 120 and the sacrificial insulating layers 118. For example, the vertical sacrificial layers 119 may include a semiconductor material such as polycrystalline silicon, a silicon-based insulating material, or a carbon-based material.

Thereafter, a first cell region insulating layer 192 covering the stack structure of the sacrificial insulating layers 118 and the interlayer insulating layers 120 may be formed.

Figure 9B:
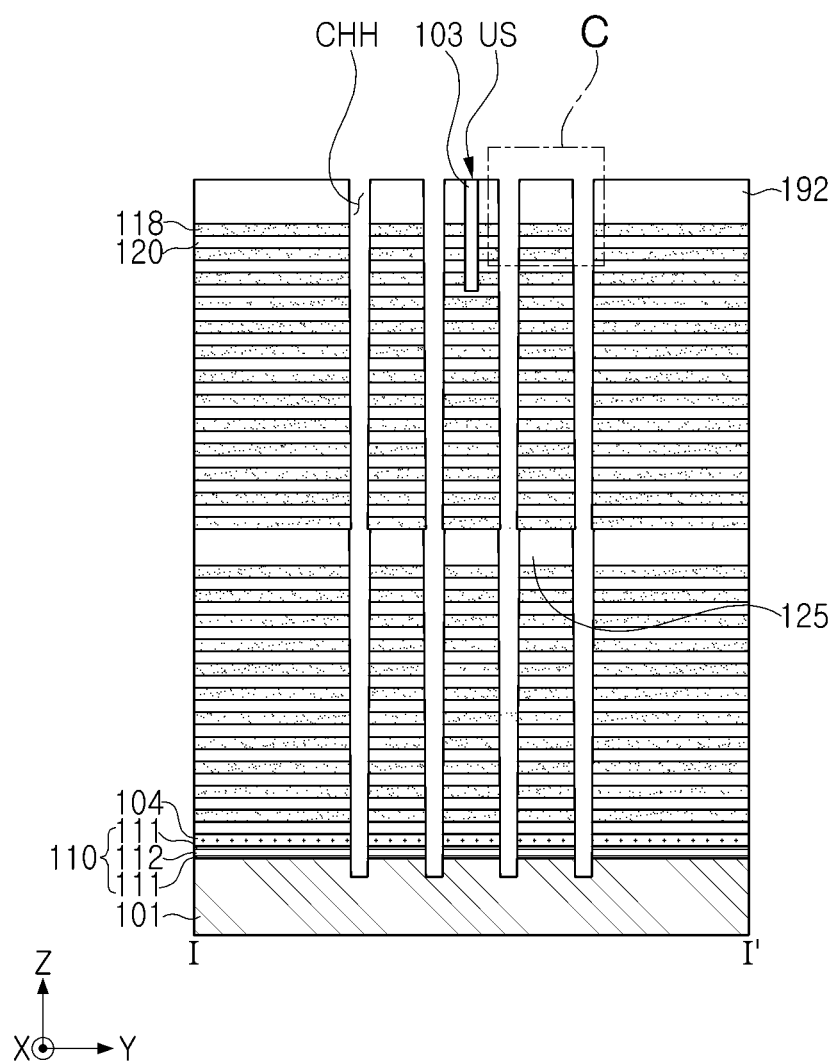

Referring to FIGS. 9B and 10, the upper isolation region US may be formed, and channel holes CHH in the stack structure of the sacrificial insulating layers 118 and the interlayer insulating layers 120 may be formed (S120).

First, the upper isolation region US may be formed by removing a portion of the sacrificial insulating layers 118 and the interlayer insulating layers 120. The upper isolation insulating layer 103 may be formed by exposing a region in which the upper isolation region US is to be formed, removing a predetermined number of the sacrificial insulating layers 118 and the interlayer insulating layers 120 from an uppermost portion, and depositing an insulating material.

The channel holes CHH may be formed by anisotropically etching the upper region of the stack structure of the sacrificial insulating layers 118 and the interlayer insulating layers 120 using a mask layer and removing the vertical sacrificial layers 119. Due to the height of the stack structure, sidewalls of the channel holes CHH may not be perpendicular to the upper surface of the substrate 101. The channel holes CHH may be formed to be recessed into a portion of the substrate 101.

Hereinafter, a process S130 of forming the channel structures CH in the channel holes CHH will be described with reference to FIGS. 9C to 9J.

Figure 9C:
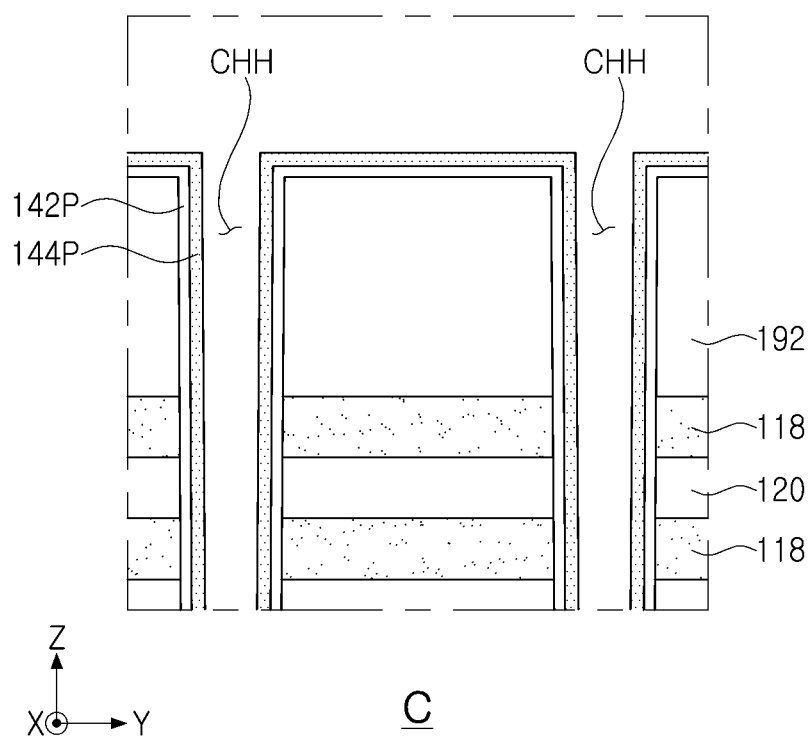

Referring to FIGS. 9C and 10, a first preliminary dielectric layer 142P and a second preliminary dielectric layer 144P may be formed in order in the channel holes CHH (S131).

The first preliminary dielectric layer 142P and the second preliminary dielectric layer 144P may be layers partially removed through a subsequent process and forming the first dielectric layer 142 and the second dielectric layer 144 in FIG. 2, respectively. The first preliminary dielectric layer 142P and the second preliminary dielectric layer 144P may be formed to have a uniform thickness using an atomic layer deposition (ALD) or chemical vapor deposition (CVD) process.

The first preliminary dielectric layer 142P and the second preliminary dielectric layer 144P may be formed to conformally extend along internal walls and bottom surfaces of the channel holes CHH. The first preliminary dielectric layer 142P and the second preliminary dielectric layer 144P may extend along the upper surface of the first cell region insulating layer 192 from an upper end of the channel holes CHH. Accordingly, each of the first preliminary dielectric layer 142P and the second preliminary dielectric layer 144P may be connected between channel holes CHH adjacent to each other.

Figure 9D:
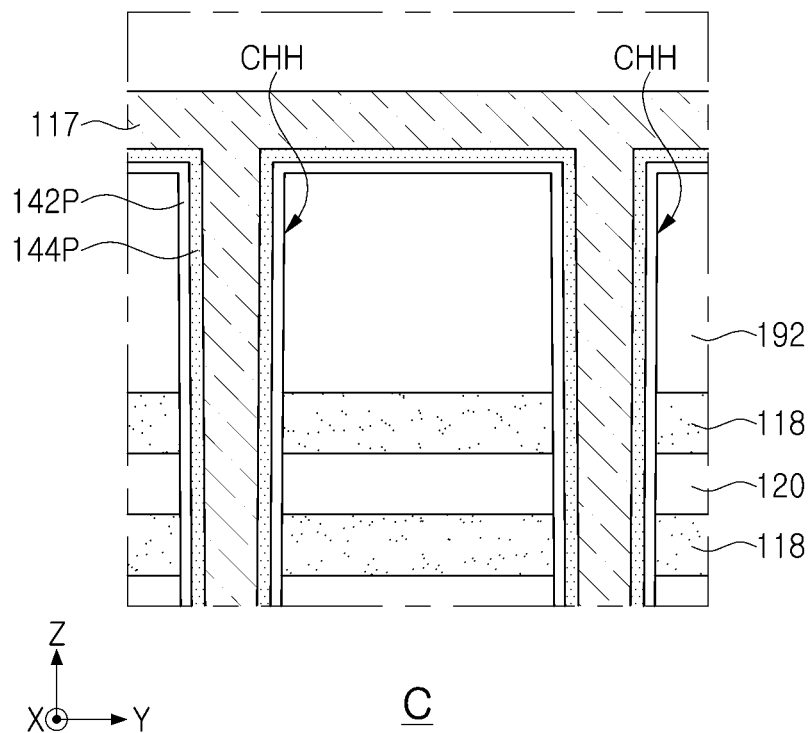

Referring to FIGS. 9D and 10, a channel sacrificial layer 117 filling the channel holes CHH may be formed (S132).

The channel sacrificial layer 117 may be formed to cover the second preliminary dielectric layer 144P and may fill the channel holes CHH. The channel sacrificial layer 117 may be removed in a subsequent process. The channel sacrificial layer 117 may be formed to extend to the first cell region insulating layer 192. The channel sacrificial layer 117 may include a material different from those of the first preliminary dielectric layer 142P and the second preliminary dielectric layer 144P, thereby having etch selectivity with respect to the first preliminary dielectric layer 142P and the second preliminary dielectric layer 144P.

Figure 9E:
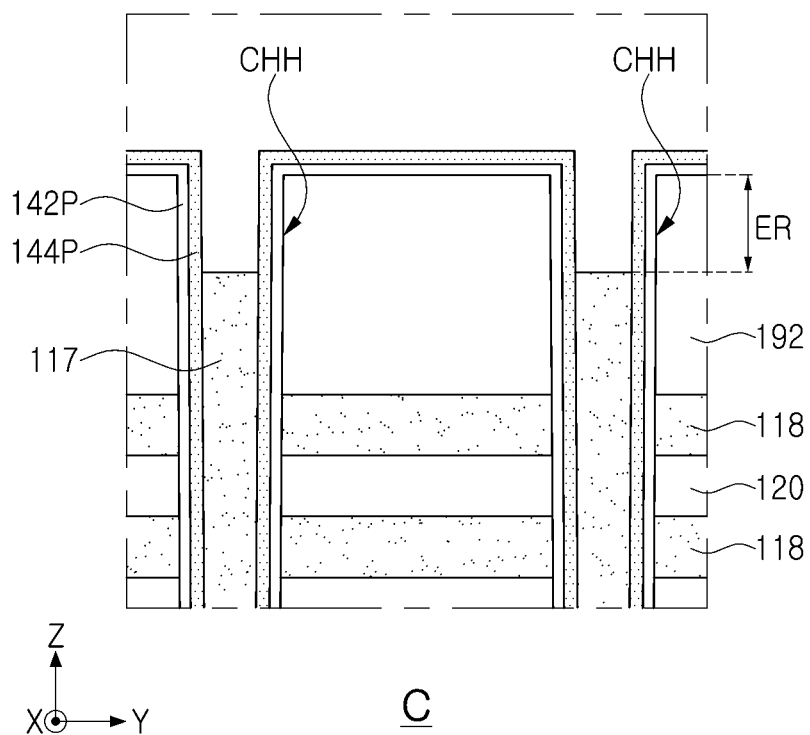

Referring to FIGS. 9E and 10, the channel sacrificial layer 117 may be partially removed such that the channel sacrificial layer 117 may not remain in the upper regions ER of the channel holes CHH (S133).

The channel sacrificial layer 117 may be removed from the upper surface to a predetermined depth by, for example, a dry etching process, and may not remain in the upper regions ER and above the upper regions ER. The lower ends of the upper regions ER may be on a level higher than a level of the uppermost sacrificial insulating layer 118 and may be varied in example embodiments.

Figure 9F:
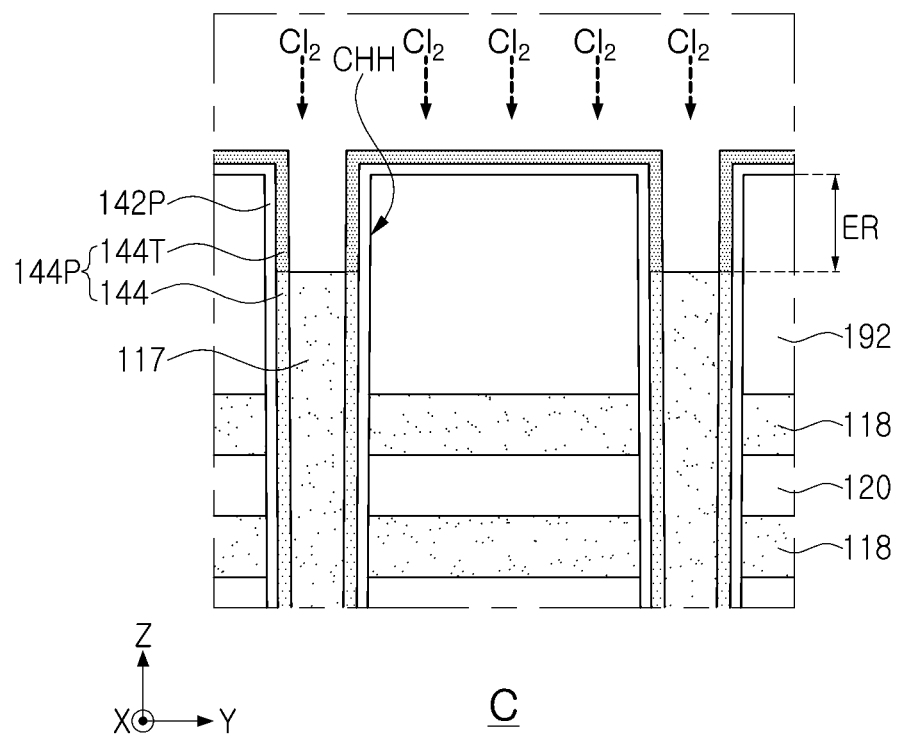

Referring to FIGS. 9F and 10, a cleaning process using chlorine (Cl$_2$) may be performed for the second preliminary dielectric layer 144P exposed in the upper regions ER (S134).

Chlorine (Cl$_2$) may be provided in a liquid state or a gaseous state. By a dry cleaning process using chlorine (Cl$_2$), the second preliminary dielectric layer 144P may be damaged in the upper regions ER. Accordingly, the second preliminary dielectric layer 144P may include the damage layer 144T and the second dielectric layers 144.

The damage layer 144T may be a region exposed in the upper regions ER and damaged by chlorine (Cl$_2$) cleaning, and the second dielectric layers 144 may be regions below the damage layer 144T and in contact with the channel sacrificial layers 117. The second dielectric layers 144 may not be affected by chlorine (Cl$_2$). However, in example embodiments, a portion of the upper region including the upper end of the second dielectric layer 144 may be affected by the cleaning process, and may include, for example, chlorine (Cl) element.

In some example embodiments, the dry cleaning process may be performed using a material other than chlorine (Cl$_2$), and a material which allows the damage layer 114T to have etch selectivity with respect to the second dielectric layer 144 may be used.

Figure 9G:
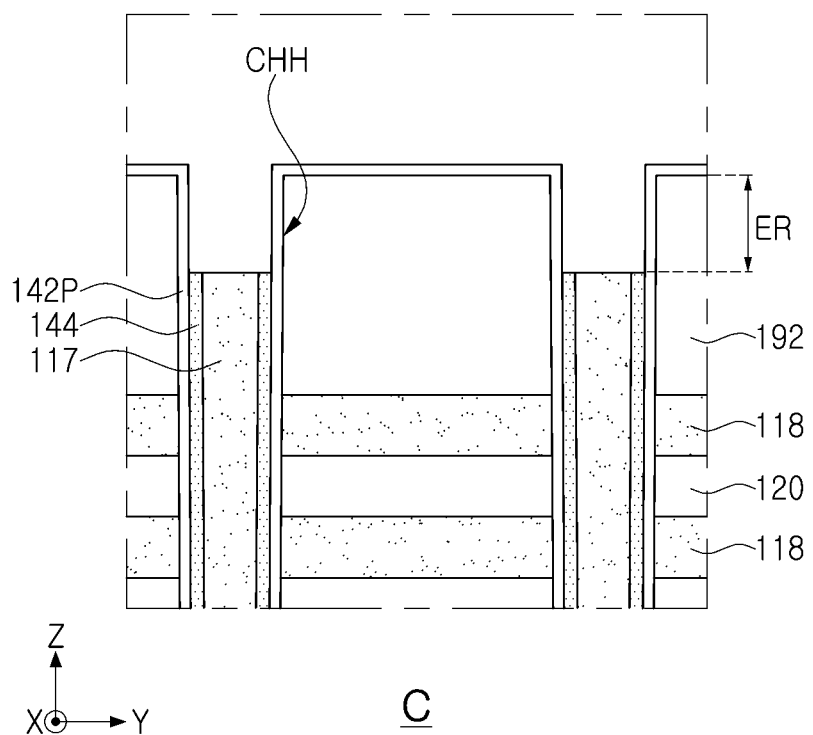

Referring to FIGS. 9G and 10, a crystallization process may be performed for the second dielectric layers 144, and the damaged layer 144T may be removed (S135).

The crystallization process may be performed through a heat treatment process. The heat treatment process may be performed, for example, in a range of about 300° C. to about 1200° C., but the temperature range may be varied depending on the thickness and the material of the second dielectric layers 144. In this process, the second dielectric layers 144 may be crystallized.

The damaged layer 144T may be removed after the crystallization process is performed. The damage layer 144T may have physical properties different from that of the second dielectric layer 144, and accordingly, the damage layer 144T may have etch selectivity. The damage layer 144T may be selectively removed with respect to the second dielectric layers 144 through, for example, a wet etching process or a dry etching process. Accordingly, the second dielectric layers 144 may remain in the channel holes CHH in a region other than the upper regions ER.

By this process, the second dielectric layers 144 may be isolated from each other between the channel holes CHH. For example, when the second dielectric layers 144 are isolated from each other between the channel holes CHH by removing the second preliminary dielectric layer 144P formed on the upper surface of the first cell region insulating layer 192 using a planarization process such as a CMP process, the second dielectric layers 144 may not be completely removed due to their relatively high hardness, such that defects may occur. In the example embodiment, by forming and removing the damage layer 144T as described above, the second dielectric layers 144 may be easily isolated between the channel holes CHH.

Figure 9H:
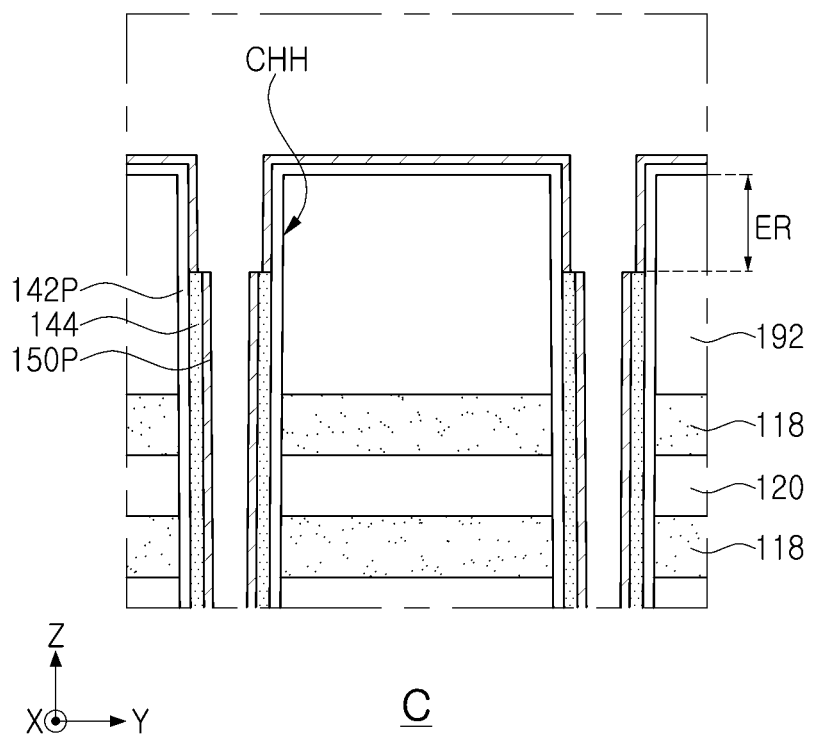

Referring to FIGS. 9H and 10, the channel sacrificial layers 117 may be removed, and a preliminary channel layer 150P may be formed in the channel holes CHH (S136).

The channel sacrificial layers 117 may be selectively removed with respect to the first preliminary dielectric layer 142P and the second dielectric layers 144 through, for example, a wet etching process or a dry etching process.

The preliminary channel layer 150P may be conformally deposited along the first preliminary dielectric layer 142P and the second dielectric layers 144. The preliminary channel layer 150P may be formed by, for example, repeatedly performing a process of depositing to a first thickness and removing a second thickness smaller than the first thickness multiple times. Accordingly, the preliminary channel layer 150P may not be formed on a region extending horizontally, for example, the upper surface of the second dielectric layer 144 as illustrated in FIG. 9H and may not be formed on the second dielectric layer 144 on the bottom surface of the channel holes CHH. However, the shape of the preliminary channel layer 150P is not limited thereto, and as the channel layers 150a and 150b in the example embodiments in FIGS. 4A and 4B, the preliminary channel layer 150P may be formed to continuously extend in some example embodiments.

Figure 9I:
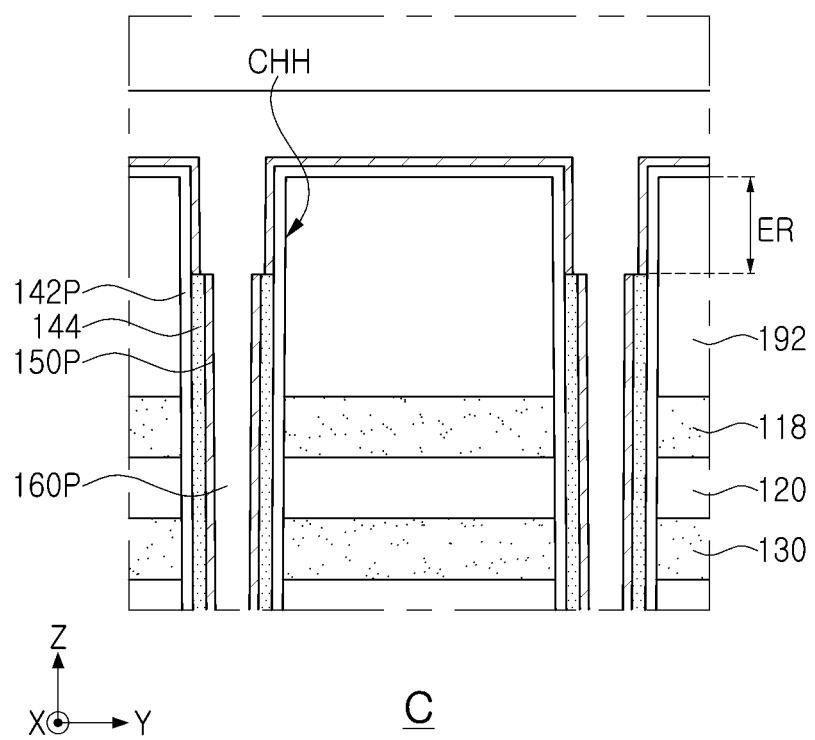

Referring to FIGS. 9I and 10, a preliminary filling insulating layer 160P may be formed in the channel holes CHH (S137).

The preliminary filling insulating layer 160P may cover the preliminary channel layer 150P and may fill the channel holes CHH. The preliminary filling insulating layer 160P may extend to the first cell region insulating layer 192.

Figure 9J:
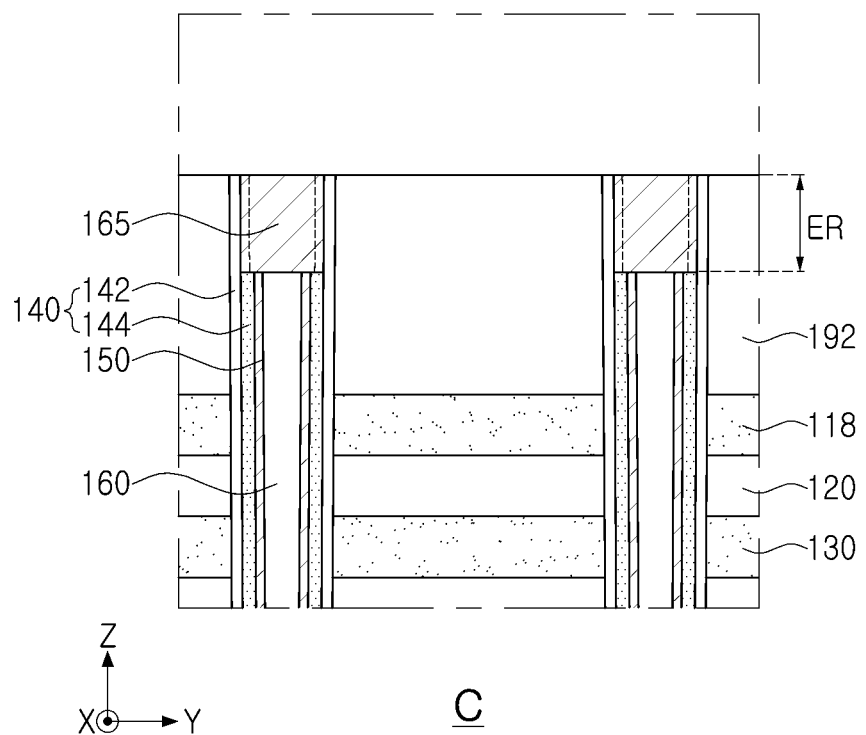

Referring to FIGS. 9J and 10, the preliminary filling insulating layer 160P may be partially removed from the upper regions ER of the channel holes CHH, and channel pad layers 165 may be formed (S138).

First, a portion of the first preliminary dielectric layer 142P, the preliminary channel layer 150P, and the preliminary filling insulating layer 160P may be removed on the first cell region insulating layer 192 by a planarization process. In some example embodiments, the upper region of the channel hole may also be removed to a predetermined depth. Each of the first preliminary dielectric layer 142P, the preliminary channel layer 150P, and the preliminary filling insulating layer 160P may be isolated from each other between the channel holes CHH by the planarization process as described above and may be configured in a plurality of layers.

Thereafter, the preliminary filling insulating layer 160P may be further removed to a predetermined depth from the upper surface of the first cell region insulating layer 192 by, for example, an etchback process. The preliminary filling insulating layer 160P may be removed to expose the preliminary channel layer 150P on the second dielectric layers 144. The preliminary filling insulating layer 160P may be removed, for example, to a level as or below the level of the upper surface of the second dielectric layer 144. In the example embodiment in FIG. 4C, the preliminary filling insulating layer 160P may be removed relatively deeply. Accordingly, the filling insulating layers 160 may be formed.

The channel pad layers 165 may be formed by filling the upper regions ER with a semiconductor material and performing a planarization process. In example embodiments, the channel pad layer 165 may include the same material as that of the preliminary channel layer 150P, and accordingly, the channel pad layer 165 may be integrated with the preliminary channel layer 150P of the upper region ER marked by a dotted line. The preliminary channel layer 150P of the upper regions ER may form the channel pad layer 165, and the preliminary channel layer 150P below the upper regions ER may form the channel layer 150. However, it may be described that a portion of the channel layer 150 may surround the side surface of the channel pad layer 165. When the channel pad layer 165 is formed, in-situ doping may be performed, and the channel pad layer 165 may include dopants.

By this process, the channel structures CH each including the dielectric layer 140, the channel layer 150, the filling insulating layer 160, and the channel pad layer 165 may be formed.

Figure 9K:
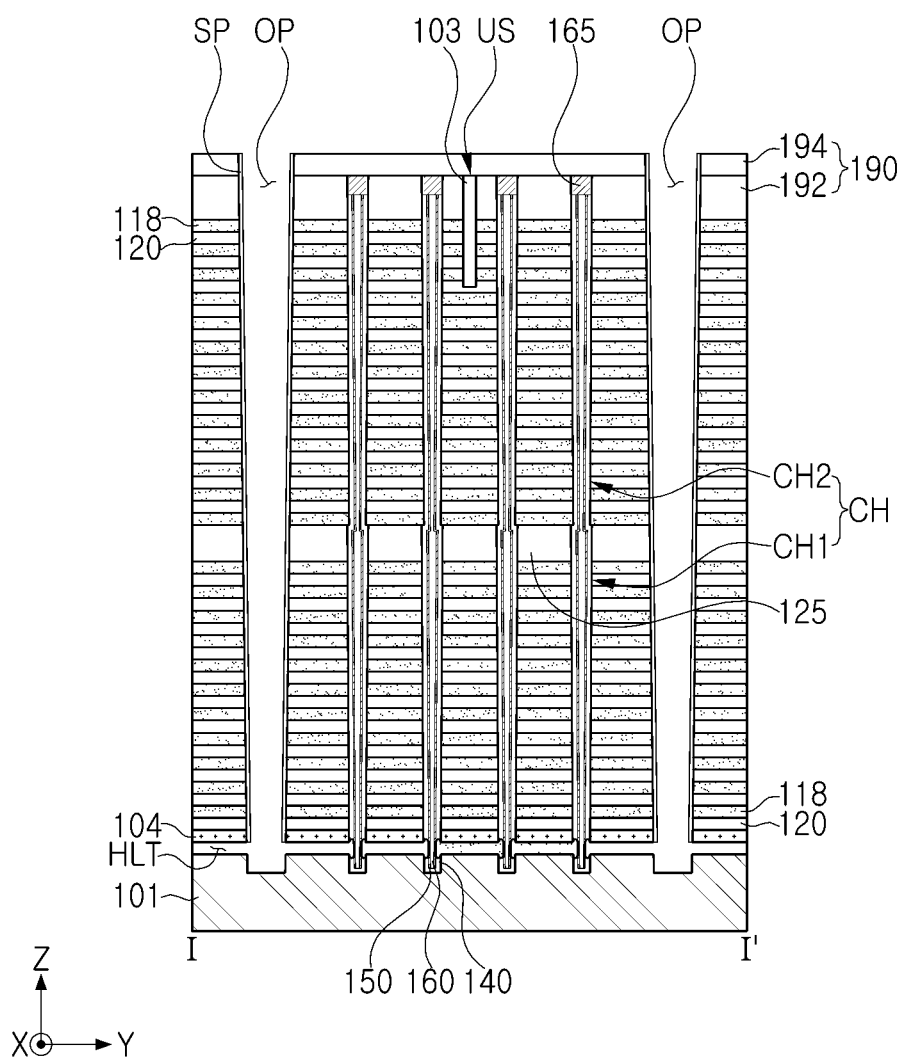

Referring to FIGS. 9K and 10, a horizontal tunnel portion HTL may be formed by forming trenches OP through the stack structure of the sacrificial insulating layers 118 and the interlayer insulating layers 120 in regions corresponding to the isolation regions MS (see FIG. 2) (S140) and removing the first and second horizontal sacrificial layers 111 and 112.

First, the second cell region insulating layer 194 may be formed on the channel structures CH, and trenches OP may be formed. The trenches OP may be formed in the stack structure of the sacrificial insulating layers 118 and the interlayer insulating layers 120, to extend into the second horizontal conductive layer 104 in a lower portion, and to extend in the x-direction.

Thereafter, sacrificial spacer layers SP may be formed in the trenches OP and the second horizontal sacrificial layer 112 may be exposed by an etchback process. A horizontal tunnel portion HTL may be formed by selectively removing the exposed second horizontal sacrificial layer 112 and removing the upper and lower first horizontal sacrificial layers 111. The horizontal sacrificial structure 110 may be removed by, for example, a wet etching process. During the process of removing the horizontal sacrificial structure 110, the dielectric layer 140 exposed in the region from which the second horizontal sacrificial layer 112 is removed may also be partially removed, such that the contact region in which the external side surface of the channel layer 150 is exposed may be formed.

Figure 9L:
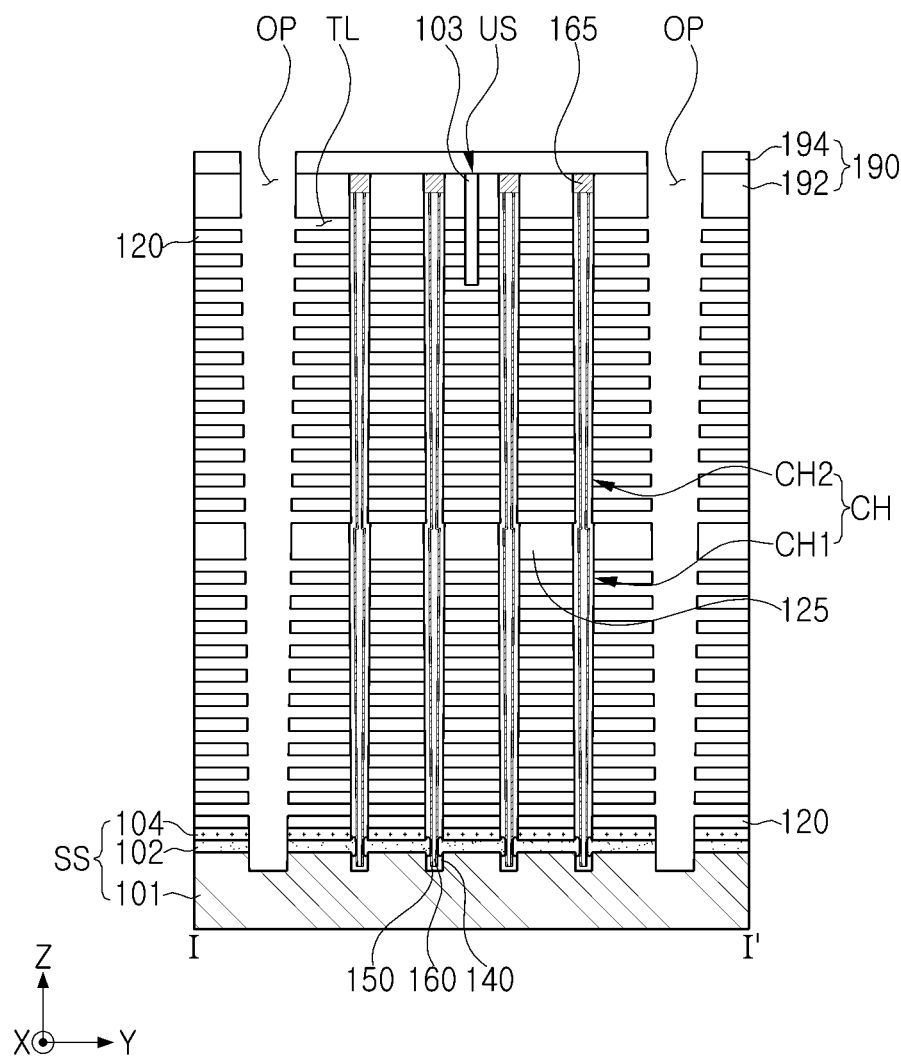

Referring to FIGS. 9L and 10, after the first horizontal conductive layer 102 is formed, the sacrificial insulating layers 118 may be removed, thereby forming tunnel portions TL (S150).

First, the first horizontal conductive layer 102 may be formed by depositing a conductive material in the horizontal tunnel portion HTL, and the sacrificial spacer layers SP may be removed from the trenches OP.

Thereafter, the sacrificial insulating layers 118 may be selectively removed with respect to the interlayer insulating layers 120 using, for example, wet etching. Accordingly, a plurality of tunnel portions TL may be formed between the interlayer insulating layers 120.

Figure 9M:
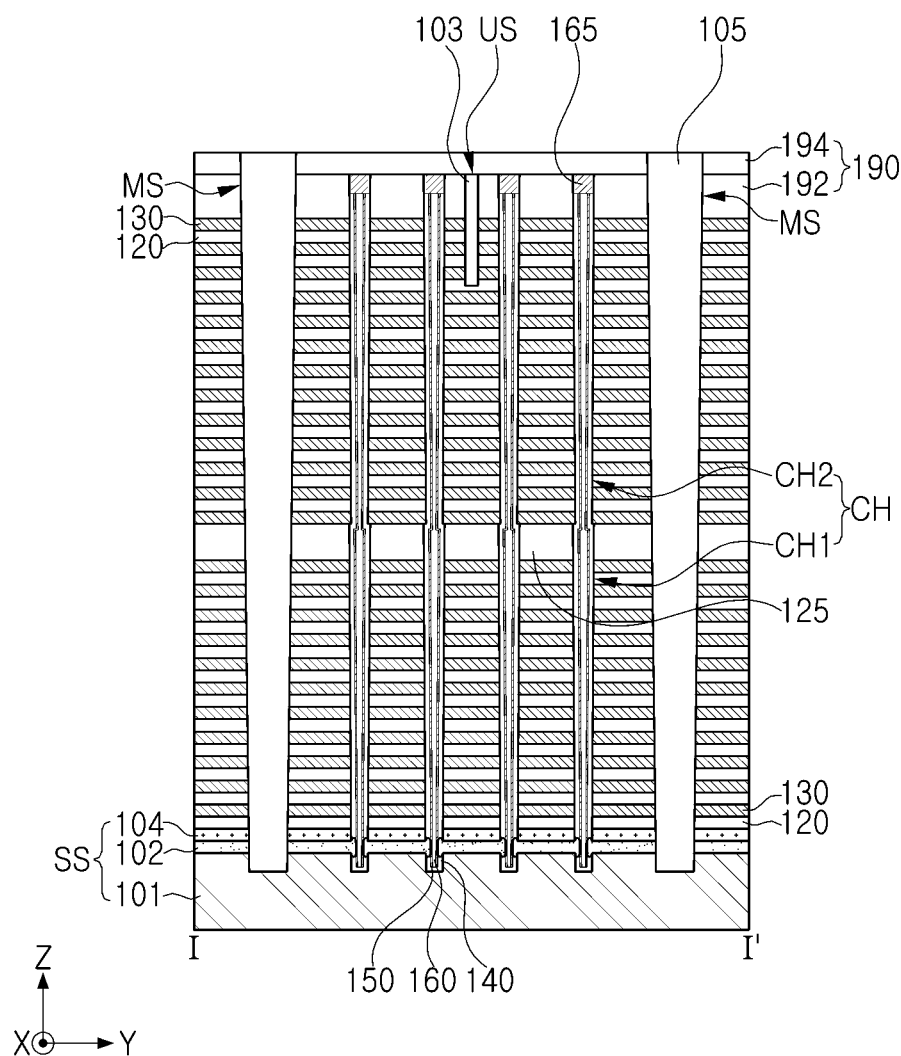

Referring to FIGS. 9M and 10, the gate electrodes 130 may be formed by filling the tunnel portions TL with a conductive material, and the isolation regions MS may be formed (S160).

The conductive material forming the gate electrodes 130 may fill the tunnel portions TL. The conductive material may include a metal, polycrystalline silicon, or a metal silicide material. After the gate electrodes 130 are formed, the isolation regions MS may be formed by removing the conductive material deposited in the trenches OP through an additional process and forming the isolation insulating layer 105. When the conductive material is removed, the gate electrodes 130 may be partially removed from the trenches OP. In this case, the isolation insulating layer 105 may include regions partially horizontally extending from the trenches OP to the side surfaces of the gate electrodes 130.

Thereafter, referring to FIG. 2, contact plugs 170 extend through the cell region insulating layer 190 and connected to the channel structures CH may be formed, and interconnection lines 180 may be formed, thereby forming the semiconductor device 100.

According to the aforementioned example embodiments, by disposing the second dielectric layer below the channel pad layer by optimizing the process of isolating the second dielectric layer including ferroelectric between the channel structures, a semiconductor device having improved integration density and mass productivity may be provided.

While the example embodiments have been illustrated and described above, it will be configured as apparent to those skilled in the art that modifications, variations, and combination of the example embodiments could be made without departing from the scope of the present disclosure as defined by the appended claims.

What is claimed is:

1. A semiconductor device, comprising:
   a source structure;
   a plurality of gate electrodes on the source structure, wherein the gate electrodes of the plurality of gate electrodes are stacked and spaced apart from each other in a first direction perpendicular to an upper surface of the source structure and extend in a second direction perpendicular to the first direction; and
   a channel structure in a channel hole extending through the plurality of gate electrodes and in the first direction, the channel structure including a first dielectric layer adjacent a sidewall of the channel hole, a second dielectric layer on an internal side surface of the first dielectric layer opposite the sidewall of the channel hole, a channel layer on an internal side surface of the second dielectric layer opposite the sidewall of the channel hole, and a filling insulating layer on an internal side surface of the channel layer opposite the sidewall of the channel hole, and further including a channel pad layer in an upper end of the channel hole, wherein the second dielectric layer includes a ferroelectric material, and wherein the channel pad layer is in contact with the internal side surface of the first dielectric layer and covers an upper surface of the second dielectric layer, an upper surface of the channel layer, and an upper surface of the filling insulating layer.

2. The semiconductor device of claim 1, wherein the first dielectric layer extends to the upper end of the channel hole.

3. The semiconductor device of claim 1, wherein at least an upper end of the second dielectric layer includes chlorine (Cl).

4. The semiconductor device of claim 1, wherein an upper end of the second dielectric layer is substantially coplanar with an upper end of the filling insulating layer.

5. The semiconductor device of claim 1, wherein the upper surface of the second dielectric layer, the upper surface of the channel layer, and the upper surface of the filling insulating layer are coplanar with each other.

6. The semiconductor device of claim 1, wherein the second dielectric layer includes a material different from a material of the first dielectric layer.

7. The semiconductor device of claim 1, wherein the first dielectric layer has a first hardness, and the second dielectric layer has a second hardness greater than the first hardness.

8. The semiconductor device of claim 1, wherein the filling insulating layer has a first hardness, and the second dielectric layer has a second hardness greater than the first hardness.

9. The semiconductor device of claim 1, wherein the second dielectric layer includes at least one of hafnium (Hf), zirconium (Zr), silicon (Si), yttrium (Y), aluminum (Al), gadolinium (Gd), strontium (Sr), lanthanum (La), titanium (Ti), scandium (Sc), or oxides thereof.

10. The semiconductor device of claim 1, wherein a thickness of the second dielectric layer along a circumference of the channel hole is in a range of about 1 nm to about 40 nm.

11. The semiconductor device of claim 1, wherein a lower surface of the channel pad layer is on a level higher than a level of an upper surface of an uppermost gate electrode of the plurality of gate electrodes.

12. The semiconductor device of claim 1, wherein the channel structure further includes a third dielectric layer interposed between the second dielectric layer and the channel layer.

13. The semiconductor device of claim 1, wherein the channel structure further includes a charge storage layer and a tunneling layer on the charge storage layer opposite the second dielectric layer and between the second dielectric layer and the channel layer.

14. The semiconductor device of claim 1, further comprising:
circuit devices below the source structure and electrically connected to the plurality of gate electrodes and the channel structure.

15. A semiconductor device, comprising:
a source structure;
a plurality of gate electrodes on the source structure, wherein the gate electrodes of the plurality of gate electrodes are stacked and spaced apart from each other in a vertical direction perpendicular to an upper surface of the source structure; and a channel structure in a channel hole extending through the plurality of gate electrodes and extending in the vertical direction, wherein the channel structure includes:

a dielectric layer extending in the vertical direction and including a ferroelectric material or an anti-ferroelectric material;

a channel layer on an internal side of the dielectric layer opposite a sidewall of the channel hole; and a channel pad layer in an upper end of the channel hole, wherein an upper end of the dielectric layer is on a level lower than a level of an upper surface of the channel pad layer.

16. The semiconductor device of claim 15, wherein at least one of the channel layer or the channel pad layer is on an upper surface of the dielectric layer.

17. The semiconductor device of claim 15, wherein the dielectric layer includes a chlorine (Cl) in a first region including the upper end of the dielectric layer, and does not include the chlorine (Cl) in a second region including a lower end of the dielectric layer.

18. The semiconductor device of claim 15, wherein the dielectric layer includes hafnium oxide doped with at least one of zirconium (Zr), silicon (Si), yttrium (Y), aluminum (Al), gadolinium (Gd), strontium (Sr), lanthanum (La), or scandium (Sc).

19. A semiconductor device, comprising:
a plate layer;
a plurality of gate electrodes on the plate layer, wherein the gate electrodes of the plurality of gate electrodes are stacked and spaced apart from each other in a vertical direction perpendicular to an upper surface of the plate layer; and a channel structure in a channel hole extending through the gate electrodes and in the vertical direction, wherein the channel structure includes:

a dielectric layer extending in the vertical direction and including a ferroelectric material;

a channel layer in an internal side of the dielectric layer opposite a sidewall of the channel hole; and a channel pad layer in a region including an upper end of the channel hole and in contact with an upper surface of the dielectric layer, and wherein data is written using a polarization state of the dielectric layer.

20. The semiconductor device of claim 19, wherein an upper end of the dielectric layer is on a level lower than a level of an upper surface of the channel pad layer and is on a level higher than a level of an upper surface of an uppermost gate electrode of the plurality of gate electrodes.

* * * * *